United States Patent
Gupta et al.

(10) Patent No.: US 12,191,254 B2
(45) Date of Patent: Jan. 7, 2025

(54) ELECTRONIC DEVICES INCLUDING TIERED STACKS INCLUDING CONDUCTIVE STRUCTURES ISOLATED BY SLOT STRUCTURES, AND RELATED SYSTEMS AND METHODS

(71) Applicant: Micron Technology, Inc., Boise, ID (US)

(72) Inventors: Sidhartha Gupta, Boise, ID (US); Anilkumar Chandolu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 418 days.

(21) Appl. No.: 17/453,041

(22) Filed: Nov. 1, 2021

(65) Prior Publication Data

US 2023/0139457 A1 May 4, 2023

(51) Int. Cl.
*H01L 23/528* (2006.01)
*H01L 21/768* (2006.01)
(Continued)

(52) U.S. Cl.
CPC .... *H01L 23/5283* (2013.01); *H01L 21/76837* (2013.01); *H01L 23/53257* (2013.01);
(Continued)

(58) Field of Classification Search
CPC ........... H01L 23/5283; H01L 21/76837; H01L 23/53257; H01L 21/7685; H01L 21/76895;
(Continued)

(56) References Cited

U.S. PATENT DOCUMENTS 10,290,650 B1 5/2019 Iwai
10,475,804 B1 11/2019 Nishikawa et al.
(Continued)

FOREIGN PATENT DOCUMENTS

CN 107658306 A 2/2018

OTHER PUBLICATIONS

Clampitt et al., Microelectronic Devices Including Voids Neighboring Conductive Contacts, and Related Memory Devices, Electronic Systems and Methods, filed Jan. 5, 2021, U.S. Appl. No. 17/141,722, 59 pages.
(Continued)

*Primary Examiner* — Herve-Louis Y Assouman
(74) *Attorney, Agent, or Firm* — TraskBritt

(57) ABSTRACT

An electronic device comprises a stack comprising tiers of alternating conductive structures and insulative structures overlying a source tier, and strings of memory cells extending vertically through the stack. The strings of memory cells individually comprise a channel material extending vertically through the stack. The electronic device comprises an additional stack overlying the stack and comprising tiers of alternating additional conductive structures and additional insulative structures, and pillars extending through the additional stack and overlying the strings of memory cells. Each of the pillars is horizontally offset in a first horizontal direction and in a second horizontal direction transverse to the first horizontal direction from a center of a corresponding string of memory cells. The electronic device comprises conductive lines overlying the pillars, and interconnect structures directly contacting the pillars and the conductive lines. Related electronic devices, systems, and methods are also described.

25 Claims, 17 Drawing Sheets

(51) Int. Cl.

| | |
|---|---|
| *H01L 23/532* | (2006.01) |
| *H10B 41/10* | (2023.01) |
| *H10B 41/27* | (2023.01) |
| *H10B 41/35* | (2023.01) |
| *H10B 43/10* | (2023.01) |
| *H10B 43/27* | (2023.01) |
| *H10B 43/35* | (2023.01) |
| *G11C 16/04* | (2006.01) |

(52) U.S. Cl.
CPC .............. *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *G11C 16/0483* (2013.01)

(58) Field of Classification Search
CPC ........ H10B 41/10; H10B 41/27; H10B 41/35; H10B 43/10; H10B 43/27; H10B 43/35; G11C 16/0483
See application file for complete search history.

(56) References Cited

U.S. PATENT DOCUMENTS

| | | | | |
|---|---|---|---|---|
| 2008/0067583 | A1* | 3/2008 | Kidoh | H01L 27/105 257/326 |
| 2011/0059595 | A1* | 3/2011 | Jung | H01L 29/7889 438/587 |
| 2012/0003800 | A1* | 1/2012 | Lee | H01L 29/7889 257/E21.645 |
| 2016/0049201 | A1* | 2/2016 | Lue | G11C 16/16 365/185.11 |
| 2017/0062330 | A1* | 3/2017 | Kim | H01L 23/5226 |
| 2017/0263723 | A1 | 9/2017 | Lee et al. | |
| 2019/0067320 | A1* | 2/2019 | Cho | H01L 23/5226 |
| 2020/0066745 | A1* | 2/2020 | Yu | G11C 5/02 |
| 2020/0227429 | A1* | 7/2020 | Ji | H10B 41/27 |
| 2020/0303399 | A1* | 9/2020 | Xiao | H01L 21/76802 |
| 2020/0365560 | A1* | 11/2020 | Kanamori | H01L 25/50 |

OTHER PUBLICATIONS

Fukuzumi et al., Microelectronic Devices Including Tiered Stacks Including Conductive Structures Isolated by Slot Structures, and Related Electronic Systems and Methods, filed Dec. 17, 2020, U.S. Appl. No. 17/127,971, 59 pages.

Gupta, Methods of Forming Microelectronic Devices, and Related Microelectronic Devices, and Memory Devices, and Electronic Systems, filed Nov. 19, 2020, U.S. Appl. No. 16/952,939, 50 pages.

Hu et al., Microelectronic Devices Including Contact Structures, and Related Electronic Systems and Methods, filed May 18, 2020, U.S. Appl. No. 16/877,233, 54 pages.

Hu, Methods of Forming Electronic Apparatus With Tiered Stacks Having Conductive Structures Isolated by Trenches, and Related Electronic Apparatus and Systems, filed May 18, 2020, U.S. Appl. No. 16/877,209, 65 pages.

Luo et al., Methods of Forming Microelectronic Devices, and Related Microelectronic Devices, Memory Devices, and Electronic Systems, filed Nov. 19, 2020, U.S. Appl. No. 16/952,913, 53 pages.

Xu et al., Methods of Forming Microelectronic Devices, and Related Microelectronic Devices, Memory Devices, and Electronic Systems, filed Mar. 18, 2021, U.S. Appl. No. 17/205,954, 77 pages.

\* cited by examiner

ELECTRONIC DEVICES INCLUDING TIERED STACKS INCLUDING CONDUCTIVE STRUCTURES ISOLATED BY SLOT STRUCTURES, AND RELATED SYSTEMS AND METHODS

TECHNICAL FIELD

Embodiments disclosed herein relate to the field of electronic device design and fabrication. More particularly, embodiments of the disclosure relate to electronic devices including tiered stacks including conductive structures isolated by slot structures, and related systems and methods of forming the electronic devices.

BACKGROUND

A continuing goal of the electronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more stack structures including tiers of conductive structures and insulative structures. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the conductive structures of the stack structure(s) of the memory device. The staircase structure includes individual "steps" defining contact regions of the conductive structures, upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the number of tiers of the conductive structures increases, processing conditions of the formation of aligned contacts to various components of an electronic device become increasingly difficult. In addition, other technologies to increase memory density have reduced the spacing between adjacent vertical memory strings. However, reducing the spacing between adjacent vertical memory strings may increase a difficulty of forming various isolation structures between the vertical memory strings.

DETAILED DESCRIPTION

Figure 1A:
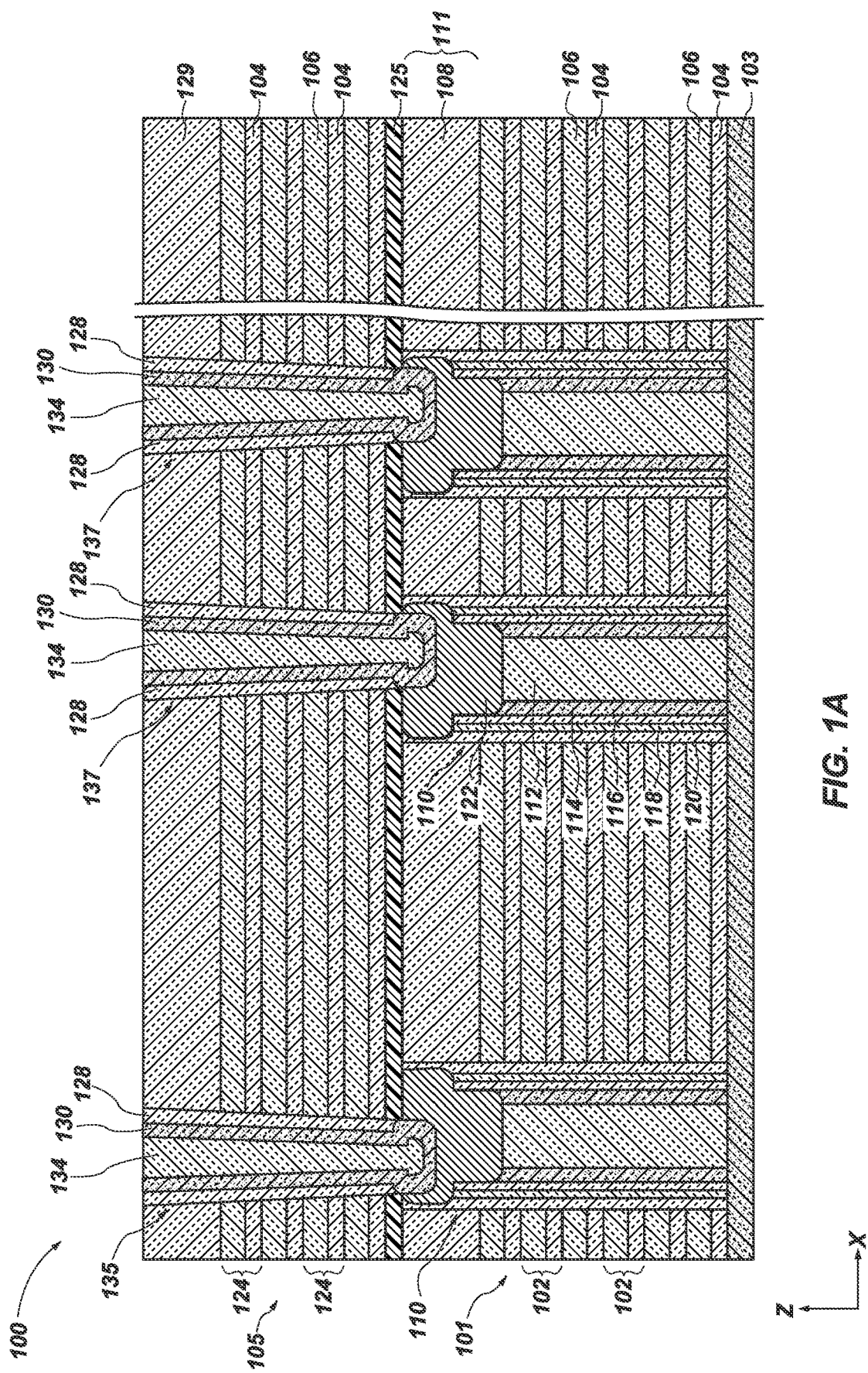
FIGS. 1A through 1J are simplified partial cross-sectional views (FIGS. 1A, 1C through 1F, and 1H) and simplified partial top-down views (FIGS. 1B, 1G, 1I, and 1J) illustrating a method of forming an electronic device, in accordance with embodiments of the disclosure, where the cross-sectional views of FIGS. 1A, 1F, and 1H are taken along the A-A line, the F-F line, and the H-H line in FIGS. 1B, 1G, and 1I, respectively.

An electronic device (e.g., an apparatus, a semiconductor device, a memory device) that includes slots segmenting the electronic device into blocks, a weave pattern of additional slots segmenting the blocks into sub-blocks, and pillars (e.g., upper pillars) adjacent to the additional slots is disclosed. The pillars are horizontally offset (e.g., in each of two horizontal directions) from a center of a corresponding string of memory cells (e.g., lower pillars) underlying the pillars. The electronic device comprises a stack comprising tiers of alternating conductive structures and insulative structures overlying a source tier, and strings of memory cells extending vertically through the stack. The strings of memory cells individually comprise a channel material extending vertically through the stack. The electronic device comprises an additional stack (e.g., an upper stack structure, a select gate drain (SGD) stack structure) overlying the stack and comprising tiers of alternating additional conductive structures and additional insulative structures, and pillars (e.g., upper pillars, which may be characterized as device structures) extending through the additional stack and overlying the strings of memory cells. Each of the pillars is horizontally offset in a first horizontal direction and in a second horizontal direction transverse to the first horizontal direction from a center of a corresponding string of memory cells. The electronic device comprises conductive lines (e.g., digit lines) overlying the pillars, and interconnect structures (e.g., digit line contacts) directly contacting the pillars and the conductive lines.

The interconnect structures may be elongated in a direction of the conductive lines. Portions of the interconnect structures may extend beyond a horizontal boundary (e.g., lateral edge) of the corresponding string of memory cells. The elongated shape of the interconnect structures may provide an increased surface area available for contact with the conductive lines. Further, the elongated shape of the interconnect structures adjacent to the conductive lines may provide a reduced resistivity (e.g., electrical resistance levels) of the conductive materials thereof without significantly affecting conductivity. In some embodiments, at least some of the pillars include a lower portion exhibiting a first width and an upper portion comprising a second, greater width. The upper portion of the pillars may include a conductive material overlying a semiconductive material. By providing a horizontal offset (e.g., in each of two horizontal directions) of the pillars within the additional stack, such configurations may, for example, facilitate direct connection of the interconnect structures to the conductive lines within individual sub-blocks of the electronic device, without the need to form additional contact structures (e.g., between the pillars and the interconnect structures).

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional electronic device fabrication techniques employed in the industry. In addition, the description provided below does not form a complete process flow for manufacturing an electronic device (e.g., a memory device, such as 3D NAND Flash memory device). The structures described below do not form a complete electronic device. Only those process acts and structures necessary to understand the embodiments of the disclosure are described in detail below. Additional acts to form a complete electronic device from the structures may be performed by conventional fabrication techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, the term "configured" refers to a size, shape, material composition, and arrangement of one or more of at least one structure and at least one apparatus facilitating operation of one or more of the structure and the apparatus in a pre-determined way.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), an electronic device combining logic and memory, or a graphics processing unit (GPU) incorporating memory.

As used herein, the term "electronic device" includes, without limitation, a memory device, as well as a semiconductor device which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "conductive material" means and includes an electrically conductive material. The conductive material may include one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon.

As used herein, a "conductive structure" means and includes a structure formed of and including one or more conductive materials.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions.

As used herein, an "insulative structure" means and includes a structure formed of and including an insulative material.

As used herein, the term "dielectric material" means and includes an electrically insulative material. The dielectric material may include, but is not limited to, one or more of an insulative oxide material or an insulative nitride material. The insulative oxide may be a silicon oxide material, a metal oxide material, or a combination thereof. The insulative oxide may include, but is not limited to, a silicon oxide ($SiO_x$, silicon dioxide ($SiO_2$)), phosphosilicate glass, borosilicate glass, borophosphosilicate glass, fluorosilicate glass, aluminum oxide ($AlO_x$), gadolinium oxide ($GdO_x$), hafnium oxide ($HfO_x$), magnesium oxide ($MgO_x$), niobium oxide ($NbO_x$), tantalum oxide ($TaO_x$), titanium oxide ($TiO_x$), zirconium oxide ($ZrO_x$), hafnium silicate, a dielectric oxynitride material (e.g., $SiO_xN_y$), a dielectric carboxynitride material (e.g., $SiO_xC_zN_y$), a combination thereof, or a combination of one or more of the listed materials with silicon oxide. The insulative nitride material may include, but is not limited to, silicon nitride.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

Figure 1B:
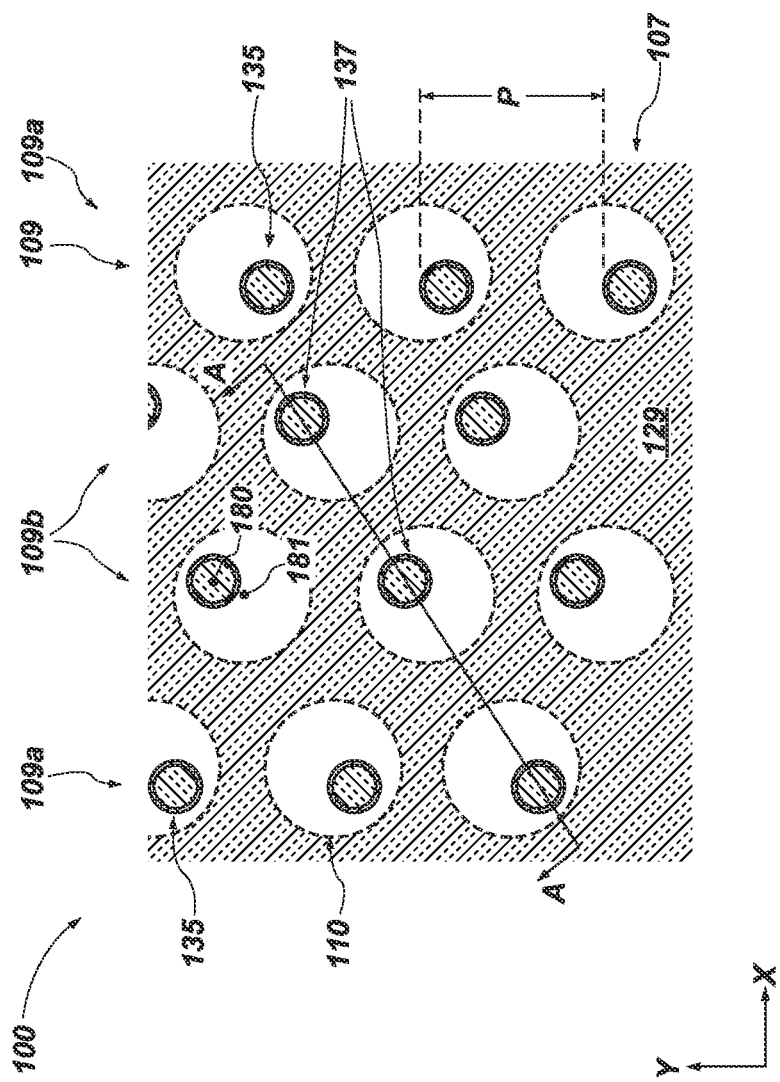
Figure 1C:
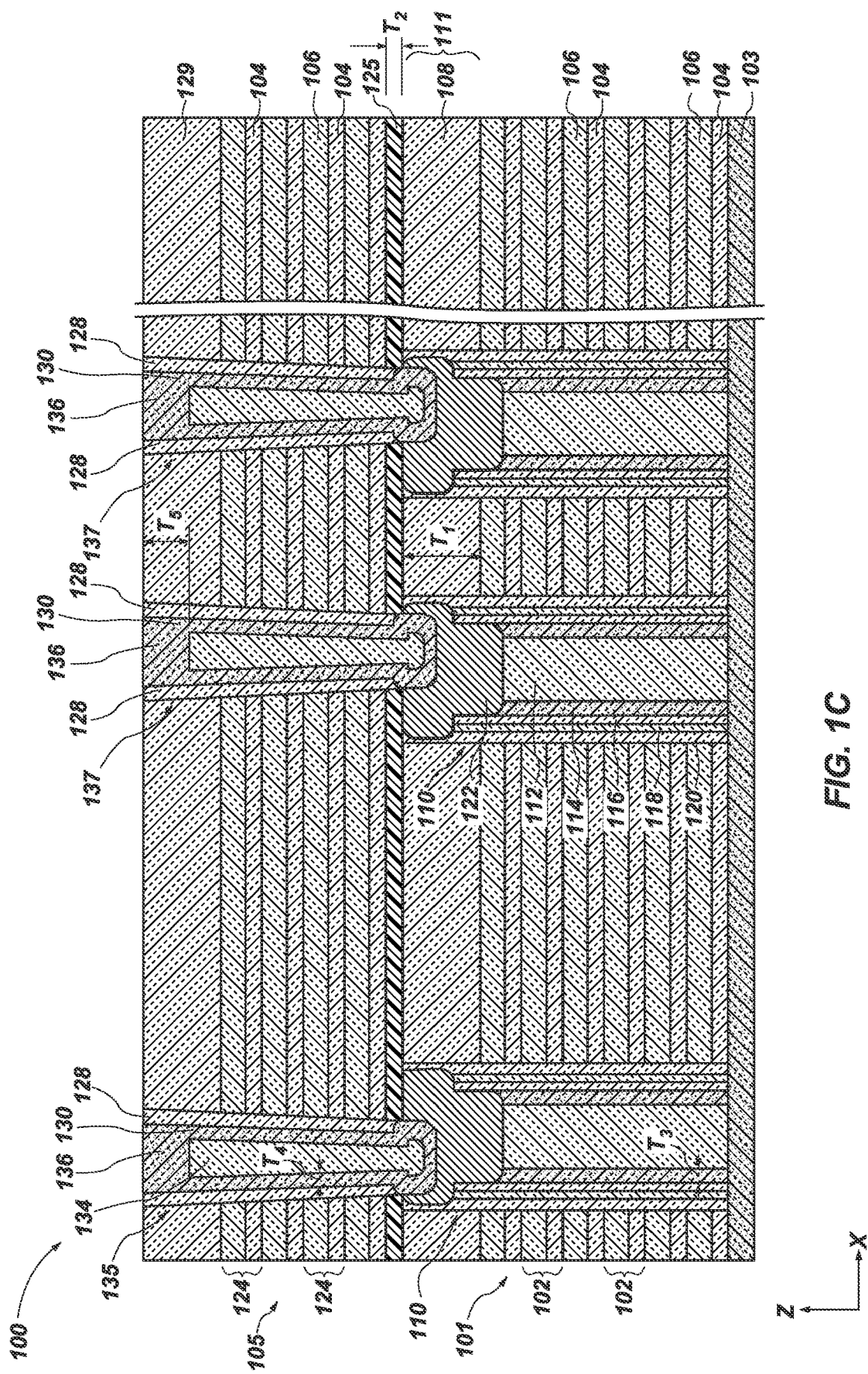
Figure 1D:
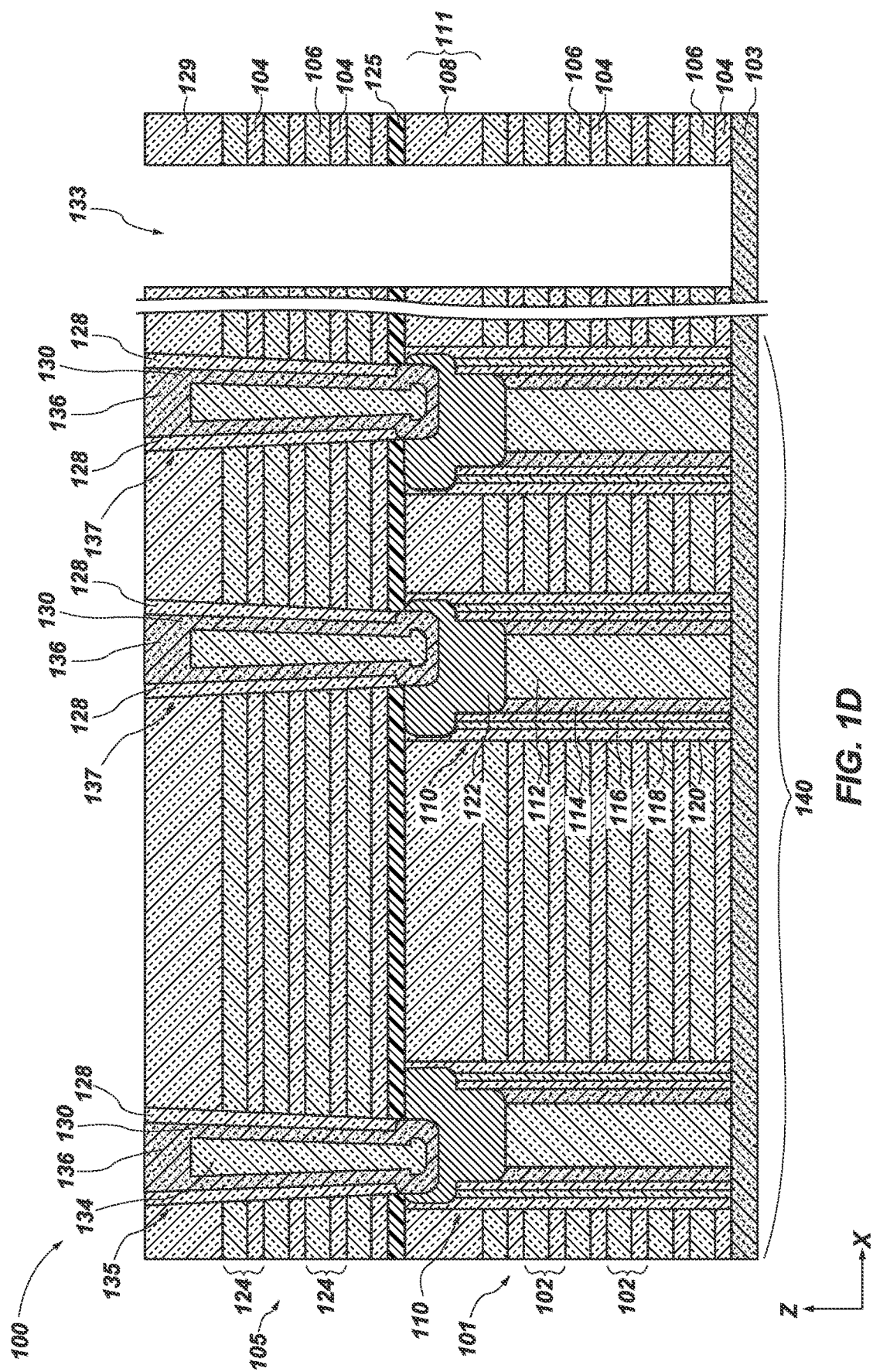
Figure 1E:
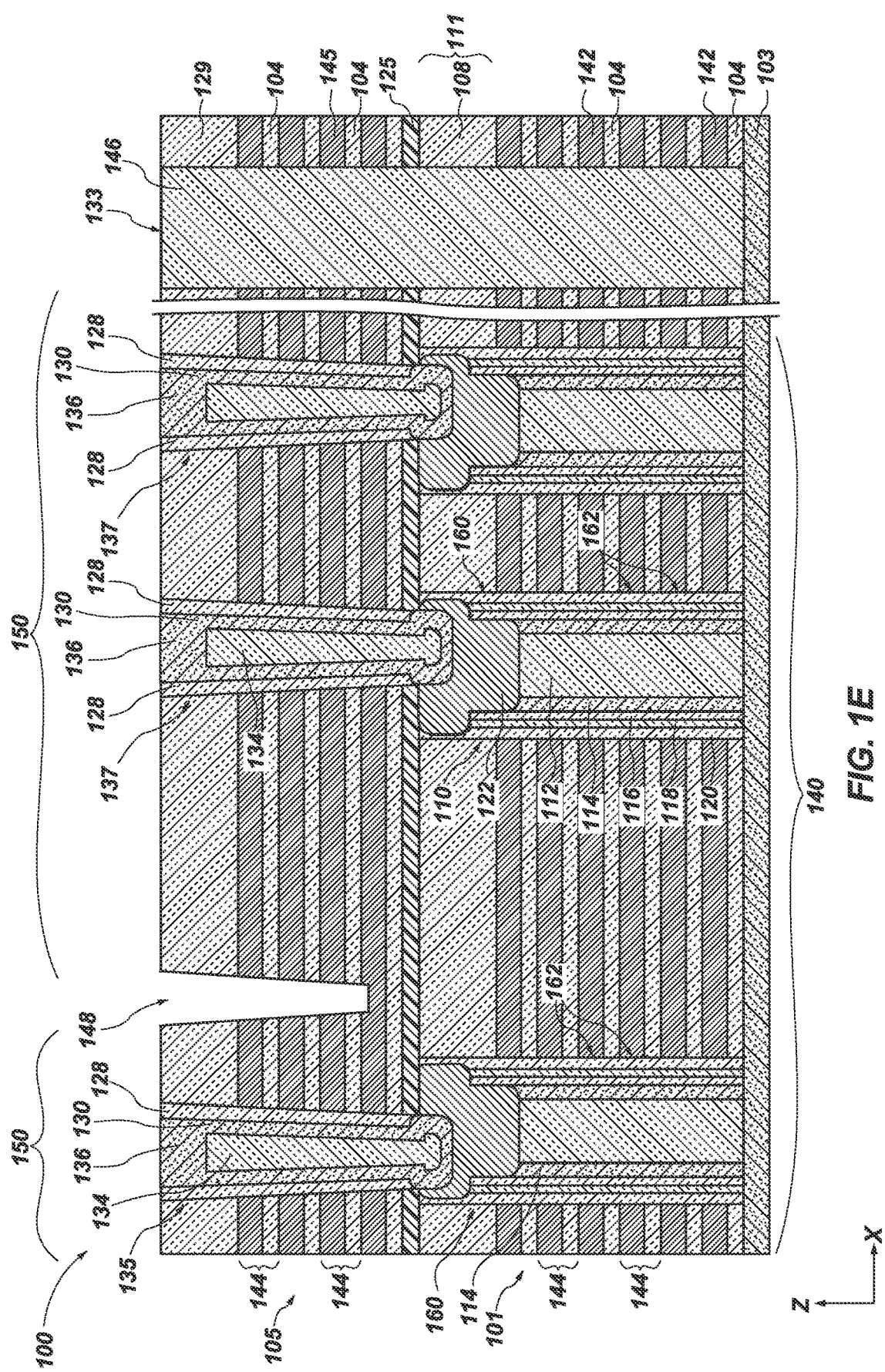
Figure 1F:
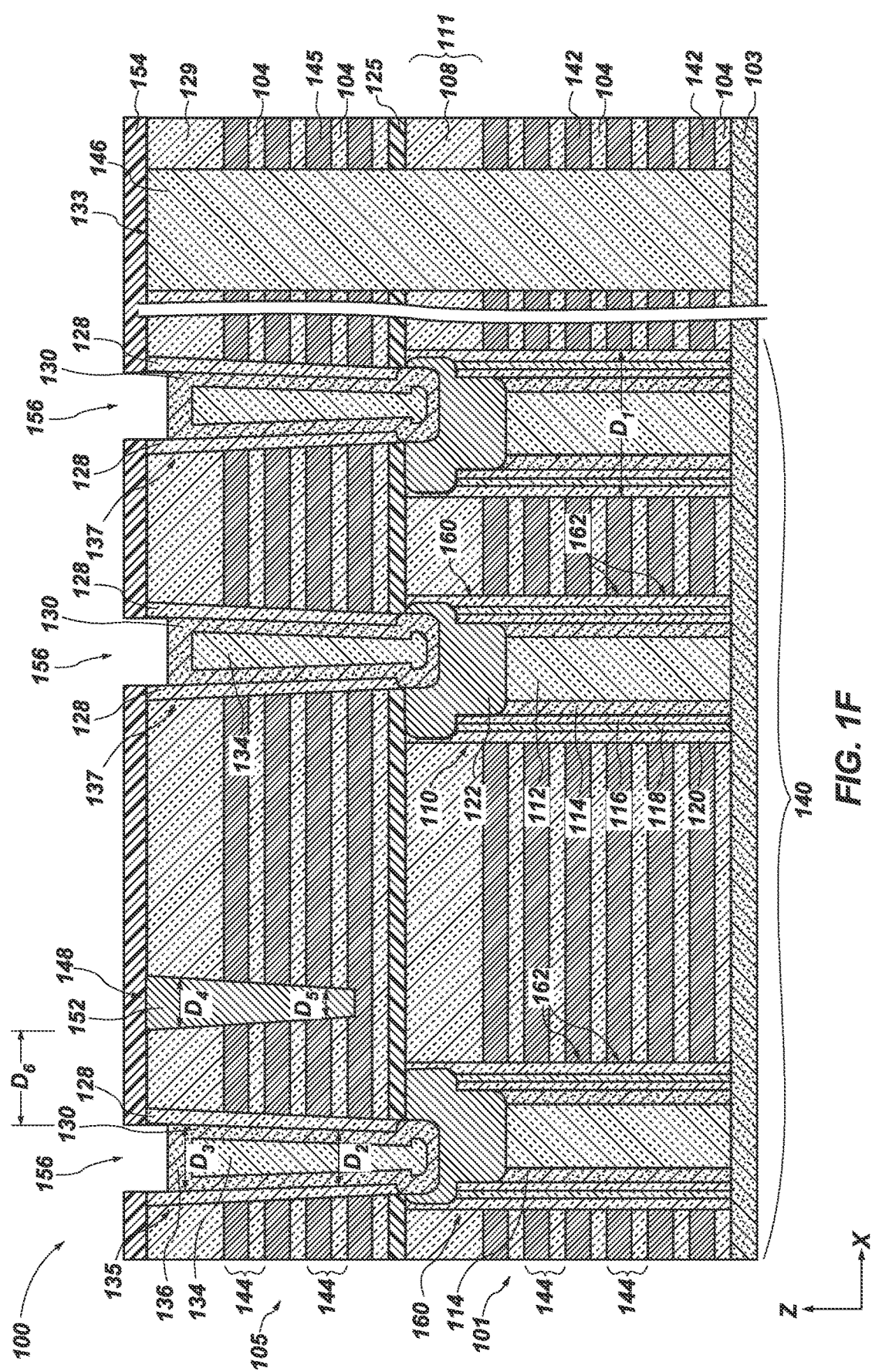
Figure 1G:
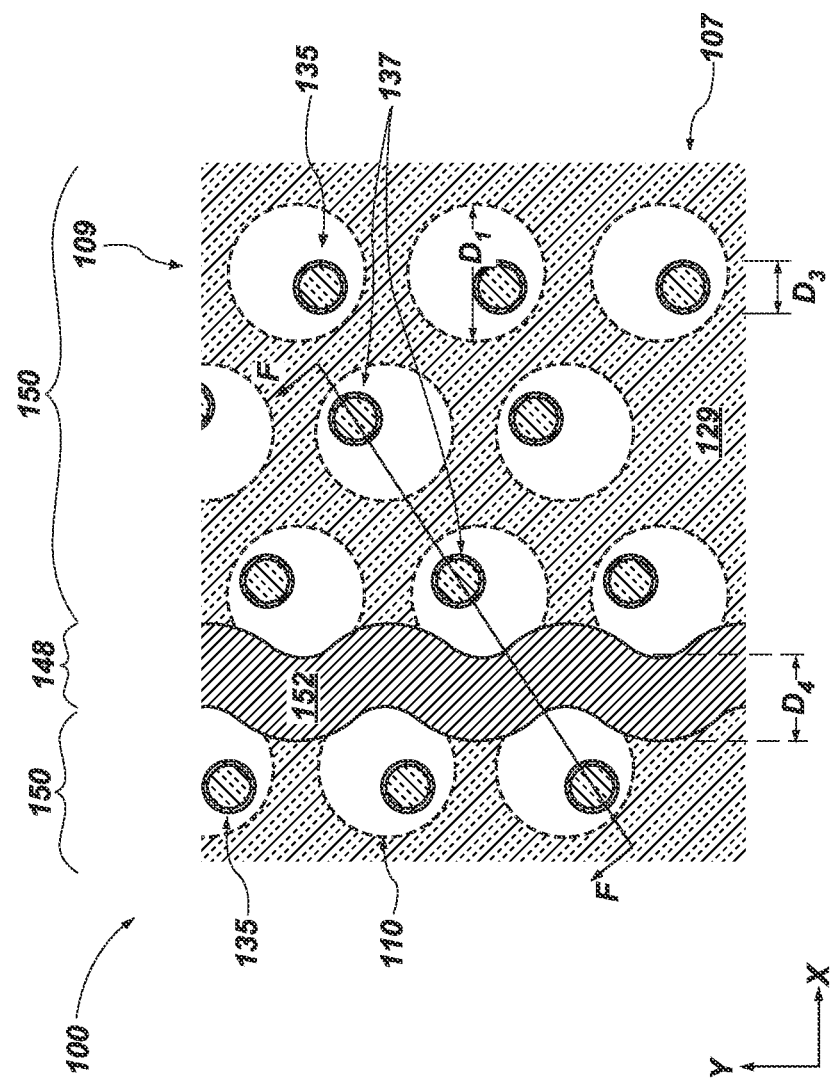
Figure 1H:
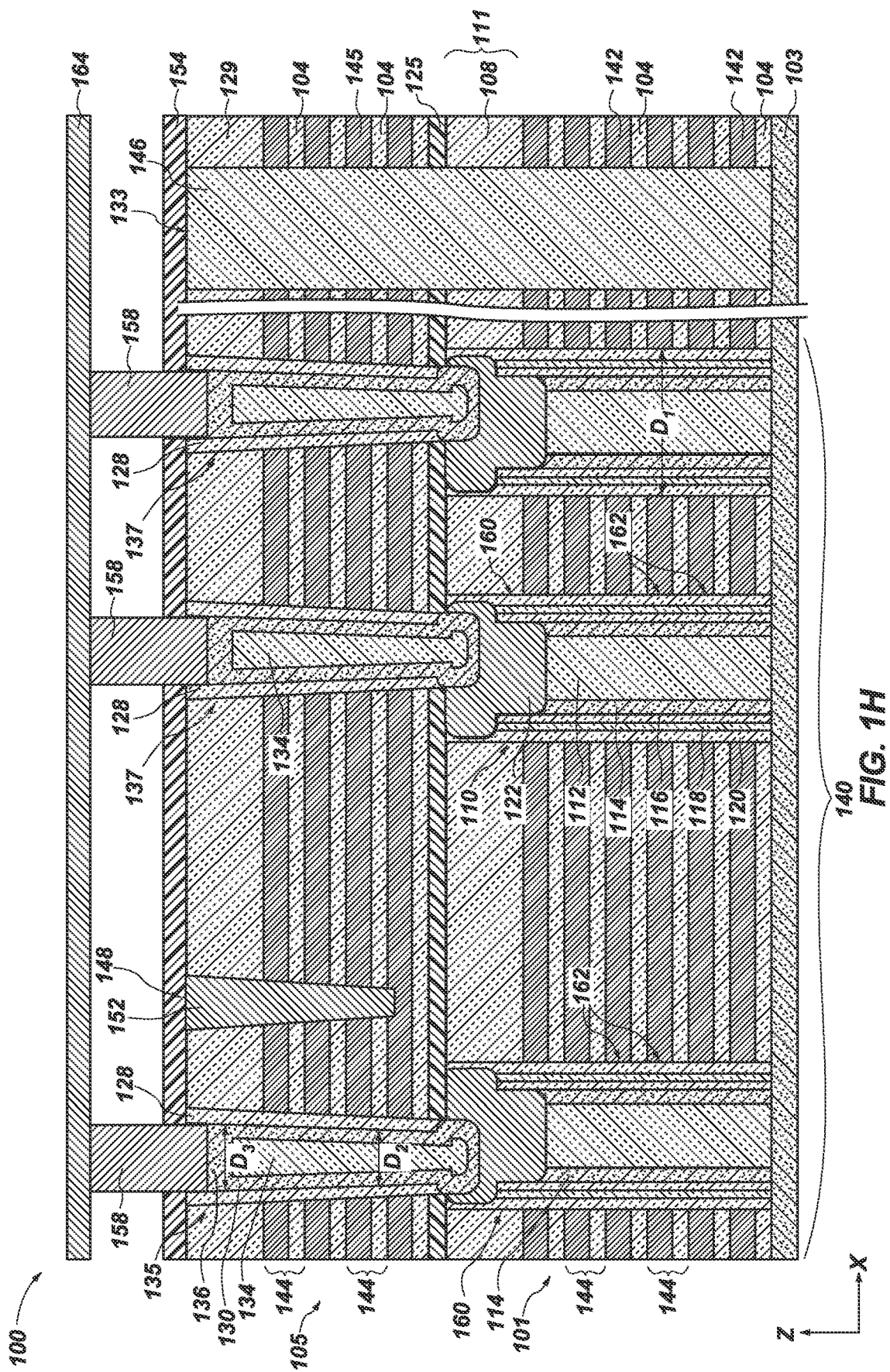
Figure 1I:
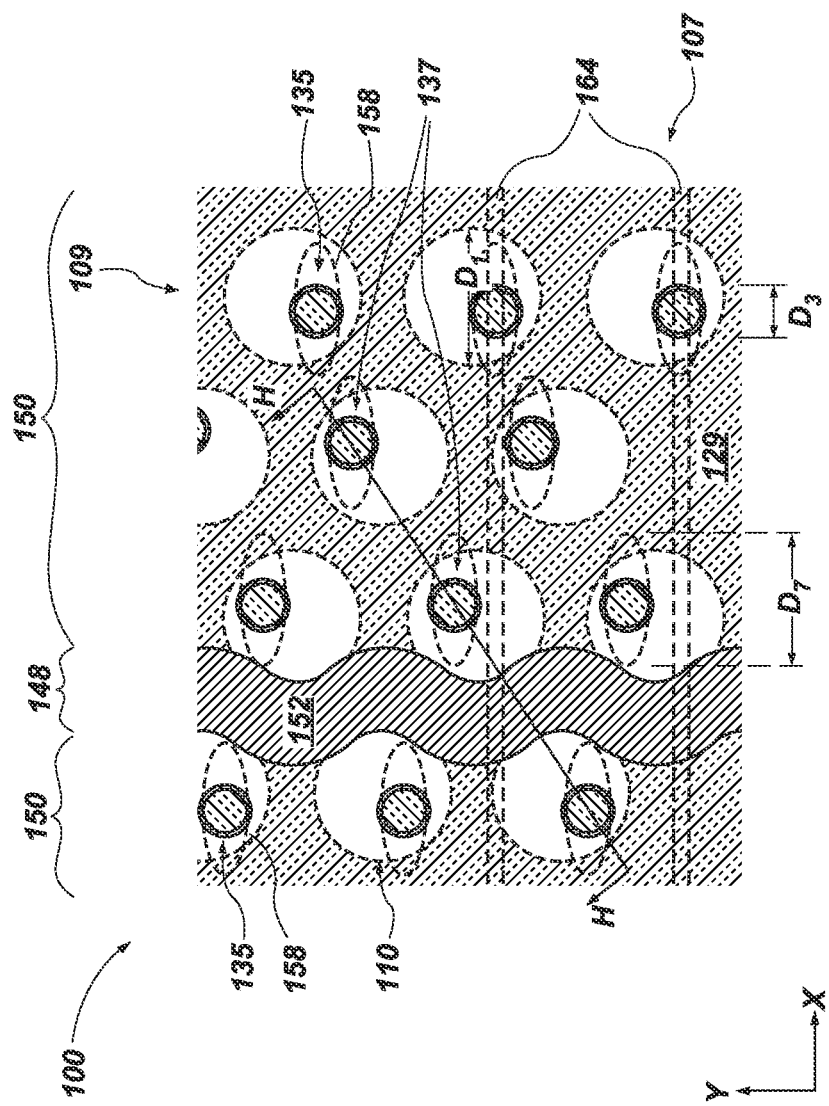
Figure 1J:
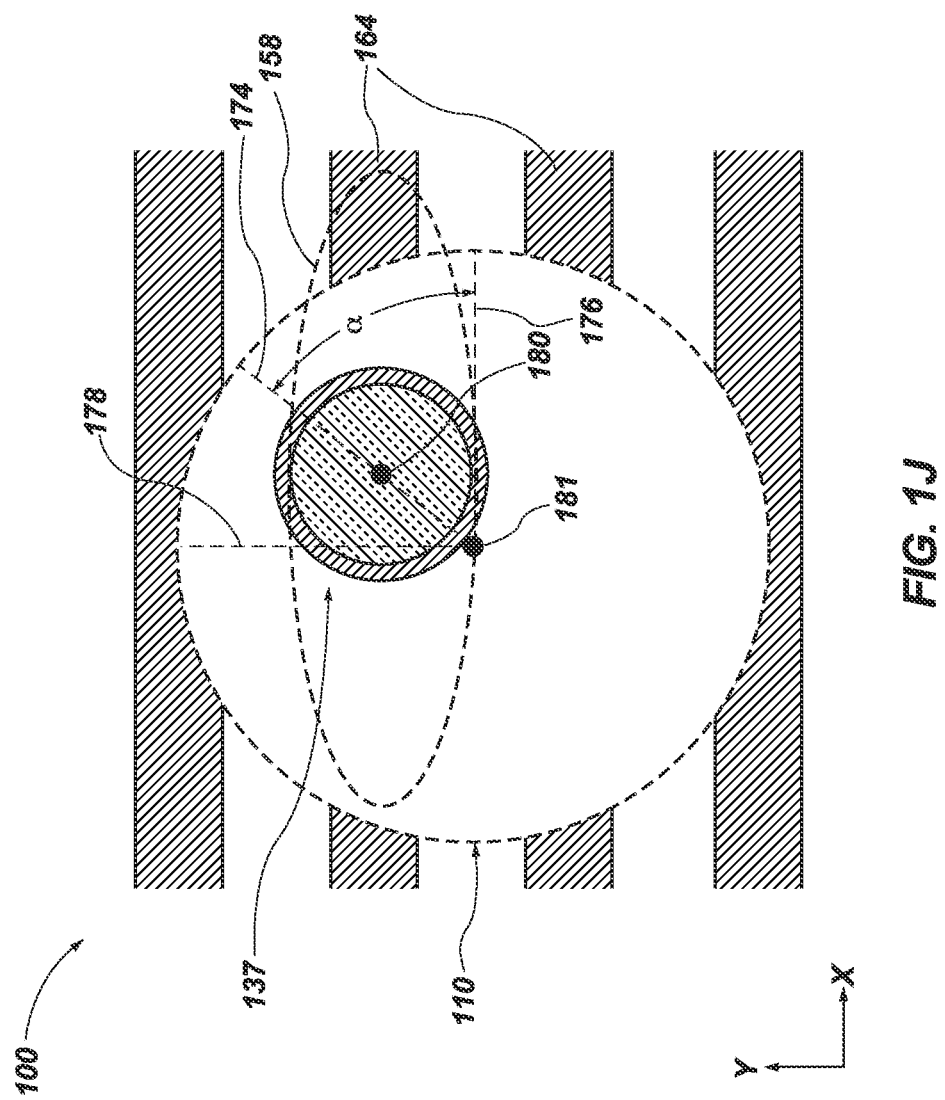

FIGS. 1A through 1J illustrate a method of forming an electronic device (e.g., a memory device, such as a 3D NAND Flash memory device), in accordance with embodiments of the disclosure, of which FIGS. 1A, 1C through 1F, and 1H are simplified partial cross-sectional views, and FIGS. 1B, 1G, 1I, and 1J are simplified partial top-down views. The cross-sectional views of FIGS. 1A, 1F, and 1H are taken along the A-A line, the F-F line, and the H-H line in FIGS. 1B, 1G, and 1I, respectively. FIG. 1J is an enlargement of a portion of FIG. 1I. For convenience in describing FIGS. 1A through 1J, a first horizontal direction may be defined as the X-direction and a second horizontal direction, which is transverse (e.g., perpendicular) to the first horizontal direction, as the Y-direction. A third direction, which is transverse (e.g., perpendicular) to each of the first horizontal direction and the second horizontal direction, may be defined as the Z-direction. Similar directions are defined, as shown in FIGS. 1K through 1N and FIG. 2, as described in greater detail below.

Referring to FIG. 1A, an electronic device 100 may be formed to include a stack 101 (e.g., a lower stack structure) including a vertically (e.g., in the Z-direction) alternating sequence of insulative structures 104 and other insulative structures 106 arranged in tiers 102. Each of the tiers 102 may individually include an insulative structure 104 directly vertically neighboring (e.g., adjacent) the other insulative structures 106. The insulative structures 104 of the stack 101 may also be referred to herein as "insulative materials" and the other insulative structures 106 of the stack 101 may also be referred to herein as "additional insulative materials."

In some embodiments, a number (e.g., quantity) of tiers 102 of the stack 101 may be within a range from 32 of the tiers 102 to 256 of the tiers 102. In some embodiments, the stack 101 includes 128 of the tiers 102. However, the disclosure is not so limited, and the stack 101 may include a different number of the tiers 102. In addition, in some embodiments, the stack 101 includes a deck structure vertically overlying a source 103 (e.g., a source tier, a source plate) and including the tiers 102 of the insulative structures 104 and the other insulative structures 106.

The insulative structures 104 may be formed of and include, for example, at least one dielectric material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), and aluminum oxide ($Al_2O_3$)). In some embodiments, the insulative structures 104 are formed of and include silicon dioxide.

The other insulative structures 106 may be formed of and include an insulative material that is different than, and exhibits an etch selectivity with respect to, the insulative structures 104. In some embodiments, the other insulative structures 106 are formed of and include a nitride material (e.g., silicon nitride ($Si_3N_4$)) or an oxynitride material (e.g., silicon oxynitride). In some embodiments, the other insulative structures 106 comprise silicon nitride.

The source 103 may be formed of and include, for example, a semiconductor material doped with one or more n-type conductivity materials (e.g., polysilicon doped with at least one p-type dopant, such as one or more of boron, aluminum, and gallium) or one or more n-type conductivity materials (e.g., polysilicon doped with at least one n-type dopant, such as one or more of arsenic, phosphorous, antimony, and bismuth). The stack 101 may be referred to herein as a deck structure or a first deck structure. Although FIG. 1A has been described and illustrated as including the stack 101 directly over (e.g., on) the source 103, the disclosure is not so limited. In other embodiments, the stack 101 overlies a deck structure comprising additional tiers 102 of the insulative structures 104 and the other insulative structures 106 separated from the stack 101 by at least one dielectric material.

A dielectric material 108 may be located over an uppermost one of the tiers 102. The dielectric material 108 may be formed of and include an electrically insulative material, such as, for example, one or more of phosphosilicate glass (PSG), borosilicate glass (BSG), fluorosilicate glass (FSG), borophosphosilicate glass (BPSG), and silicon dioxide. In some embodiments, the dielectric material 108 comprises the same material composition as the insulative structures 104. In some embodiments, the dielectric material 108 comprises silicon dioxide.

Pillars 110 (e.g., cell pillars, memory pillars) of materials may vertically extend (e.g., in the Z-direction) through the stack 101. The materials of the pillars 110 may form memory cells (e.g., strings of memory cells). The pillars 110 may each individually comprise an insulative material 112, a channel material 114 horizontally neighboring the insulative material 112, a tunnel dielectric material 116 (also referred to as a "tunneling dielectric material") horizontally neighboring the channel material 114, a memory material 118 horizontally neighboring the tunnel dielectric material 116, and a dielectric blocking material 120 (also referred to as a "charge blocking material") horizontally neighboring the memory material 118. The dielectric blocking material 120 may be horizontally neighboring one of the other insulative structures 106 of one of the tiers 102 of the stack 101. The channel material 114 may be horizontally interposed between the insulative material 112 and the tunnel dielectric material 116, the tunnel dielectric material 116 may be horizontally interposed between the channel material 114 and the memory material 118, the memory material 118 may be horizontally interposed between the tunnel dielectric material 116 and the dielectric blocking material 120, and the dielectric blocking material 120 may be horizontally interposed between the memory material 118 and the other insulative structure 106.

The insulative material 112 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 112 comprises silicon dioxide.

The channel material 114 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 114 includes amorphous silicon or polysilicon. In some embodiments, the channel material 114 comprises a doped semiconductor material.

The tunnel dielectric material 116 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 116 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 116 comprises silicon dioxide. In other embodiments, the tunnel dielectric material 116 comprises silicon oxynitride.

The memory material 118 may comprise a charge trapping material or a conductive material. The memory material 118 may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 118 comprises silicon nitride.

The dielectric blocking material 120 may be formed of and include a dielectric material such as, for example, one or more of an oxide (e.g., silicon dioxide), a nitride (silicon nitride), and an oxynitride (silicon oxynitride), or another material. In some embodiments, the dielectric blocking material 120 comprises silicon oxynitride.

In some embodiments the tunnel dielectric material 116, the memory material 118, and the dielectric blocking material 120 together may comprise a structure configured to trap a charge, such as, for example, an oxide-nitride-oxide (ONO) structure. In some such embodiments, the tunnel dielectric material 116 comprises silicon dioxide, the memory material 118 comprises silicon nitride, and the dielectric blocking material 120 comprises silicon dioxide.

After forming the pillars 110, a portion of the pillars 110 may be removed to recess the pillars 110 relative to an uppermost surface of the dielectric material 108. In some embodiments, a portion of the insulative material 112 and the channel material 114 may be recessed vertically lower (e.g., in the Z-direction) than the other components of the pillars 110 (e.g., the tunnel dielectric material 116, the memory material 118, the dielectric blocking material 120). In some embodiments, a conductive material 122 may be formed within the recesses to form a so-called "conductive plug structure." The conductive material 122 may be formed of and include, a polysilicon or another material formulated to exhibit an etch selectivity with respect to the material of the dielectric material 108 and, in some embodiments, with respect to one or more of the materials of the pillar 110. In some embodiments, the conductive material 122 is electrically connected to (e.g., in electrical communication with) the channel material 114. In some embodiments, the conductive material 122 comprises doped polysilicon. In some embodiments, the conductive material 122 is doped with one or more n-type dopants such as, for example, phosphorus. In some embodiments, the conductive material 122 is lightly doped (e.g., at a concentration of about $1 \times 10^{18}$ atoms/cm$^3$). The conductive material 122 may comprise sharp corners or, alternatively, the conductive material 122 may comprise rounded corners, as shown in FIG. 1A. After forming the conductive material 122, the electronic device 100 may be exposed to a chemical mechanical planarization (CMP) process to remove conductive material from outside surfaces of the recesses (e.g., on an upper surface of the dielectric material 108).

With continued reference to FIG. 1A, after forming the conductive material 122, another stack 105 (e.g., an upper stack structure, a select gate drain (SGD) stack structure) may be formed over the stack 101. The stack 101 may also be referred to herein as an additional deck structure or a second deck structure. The other stack 105 may include a vertically alternating sequence of additional insulative structures 104 and additional other insulative structures 106 formed over an optional etch stop material 125. The additional insulative structures 104 and the additional other insulative structures 106 may be arranged in tiers 124. The dielectric material 108 between the stack 101 and the other stack 105 may be referred to as an interdeck region 111. The other stack 105 may include an uppermost insulative structure 129 having a greater thickness in a vertical direction (e.g., in the Z-direction) than other insulative structures 104 of the other stack 105.

The etch stop material 125, if present, may be formed of and include, for example, a material exhibiting an etch selectivity with respect to the insulative structures 104 and the other insulative structures 106. In some embodiments, the etch stop material 125 comprises a carbon-containing material (e.g., silicon carbon nitride (SiCN)). In some such embodiments, the etch stop material 125 may facilitate an improved electric field through a channel region proximate the etch stop material 125 during use and operation of the electronic device 100. In some embodiments, the electronic device 100 may not include the etch stop material 125 between the stack 101 and the other stack 105. In some such embodiments, the dielectric material 108 (e.g., alone) may intervene between the stack 101 and the other stack 105.

Upper pillars may vertically extend (e.g., in the Z-direction) through the other stack 105. The upper pillars may include first upper pillars 135 and second upper pillars 137 (collectively referred to as upper pillars 135, 137). At least some (e.g., each) of the upper pillars 135, 137 are horizontally offset (e.g., are not concentric) with the pillars 110, as described in greater detail with reference to FIG. 1B. For example, a central axis 180 (FIG. 1B) of each of the upper pillars 135, 137 may be horizontally offset (e.g., in each of the X-direction and the Y-direction) relative to a central axis 181 (FIG. 1B) of the vertically underlying (e.g., in the Z-direction) pillars 110. The upper pillars 135, 137 may extend into the conductive material 122 and horizontal boundaries (e.g., lateral edges) of the upper pillars 135, 137 may not extend beyond horizontal boundaries (e.g., lateral edges) of the pillars 110. As described below, some of the first upper pillars 135 and the second upper pillars 137 may neighbor (e.g., be located adjacent to) slot structures separating blocks of the electronic device 100 into one or more sub-blocks.

As shown in FIG. 1A, the upper pillars 135, 137 may each individually include a liner material 128, a channel material 130 horizontally neighboring the liner material 128, and an insulative material 134 horizontally neighboring the channel material 130. The liner material 128 may be horizontally neighboring the additional other insulative structures 106 of the tiers 124 of the other stack 105. The channel material 130 may be horizontally interposed between the liner material 128 and the insulative material 134. The insulative material 134 may also vertically overlie (e.g., in the Z-direction) the channel material 130, such as a horizontally extending portion of the channel material 130 over the conductive material 122.

The liner material 128 may be formed of and include, for example, an insulative material, such as one or more of the materials described above with reference to the insulative material 112. In some embodiments, the liner material 128 comprises silicon dioxide. The channel material 130 may be in electrical communication with the channel material 114 through the conductive material 122. The channel material 130 may comprise one or more of the materials described above with reference to the channel material 114. In some embodiments, the channel material 130 comprises the same material composition as the channel material 114. In some embodiments, the channel material 130 may be continuous with the channel material 114. Since the channel material 130 may comprise the same material composition as the channel material 114 and the channel material 130 is in electrical communication with the channel material 114 through the conductive material 122, as used herein, the channel material 114, the conductive material 122, and the channel material 130 may be collectively referred to as a channel region. The channel material 130 may comprise sharp corners or, alternatively, the channel material 130 may comprise rounded corners, as shown in FIG. 1A.

The insulative material 134 may be formed of and include one or more of the materials described above with reference to the insulative material 112. In some embodiments, the insulative material 134 comprises substantially the same material composition as the insulative material 112. In some embodiments, the insulative material 134 comprises silicon dioxide. In some embodiments, the electronic device 100 is exposed to a planarization process, such as a CMP process, after forming the insulative material 134.

Referring to FIG. 1B, some of the pillars 110 may be aligned with each other (e.g., in the Y-direction) and other of the pillars 110 may be offset from each other (e.g., in the Y-direction). The pillars 110 may be arranged in a so-called weave pattern (e.g., a hexagonal close-packed arrangement), which may facilitate an increased density of the pillars 110 (and the resulting strings of memory cells) in the stack 101. The pillars 110 may be arranged in rows 107 extending in a first horizontal (e.g., lateral) direction (e.g., in the X-direction) and columns 109 extending in a second horizontal direction (e.g., in the Y-direction). In some embodiments, the pillars 110 in a column 109 may be laterally offset (e.g., in each of the X-direction and the Y-direction) from pillars 110 in a neighboring (e.g., adjacent) column 109. In addition, the pillars 110 of every other column 109 may be horizontally aligned (e.g., in the Y-direction). Similarly, the pillars 110 of a row 107 may be horizontally offset (e.g., in each of the X-direction and the Y-direction) from the pillars 110 in a neighboring (e.g., adjacent) row 107. In addition, the pillars 110 of every other row 107 may be horizontally aligned (e.g., in the X-direction). In FIG. 1B, the pillars 110 are illustrated in broken lines to indicate that they are located below an upper surface of the electronic device 100.

A pitch P between horizontally neighboring (e.g., in the Y-direction, a direction in which the slot structures will be formed) pillars 110 may be within a range from about 120 nanometers (nm) to about 180 nm, such as from about 120 nm to about 140 nm, from about 140 nm to about 160 nm, or from about 160 nm to about 180 nm. In some embodiments, the pitch P is from about 140 nm to about 150 nm or from about 150 nm to about 160 nm. However, the disclosure is not so limited and the pitch P may be different than that described.

With continued reference to FIG. 1B, the first upper pillars 135 and the second upper pillars 137 may be similarly arranged in the rows 107 extending in the first horizontal (e.g., lateral) direction (e.g., in the X-direction) and in the columns 109 extending in the second horizontal direction (e.g., in the Y-direction). The upper pillars 135, 137 in a column 109 may be horizontally offset (e.g., in each of the X-direction and the Y-direction) from the upper pillars 135, 137 in at least one neighboring (e.g., adjacent) column 109. For example, the first upper pillars 135 of a first column 109a may be horizontally aligned (e.g., in the Y-direction) with one another, and the second upper pillars 137 of a second column 109b may be horizontally aligned (e.g., in the Y-direction) with one another. In some embodiments, two (e.g., a pair) of the first columns 109a of the first upper pillars 135 may be separated from one another in the first horizontal direction by two of the second columns 109b of the second upper pillars 137. In other words, a set of four of the columns 109 may include two of the first columns 109a of the first upper pillars 135 adjacent to one another and two of the second columns 109b of the second upper pillars 137 adjacent to one another. Further, one of the first columns 109a of the first upper pillars 135 and one of the second columns 109b of the second upper pillars 137 may neighbor (e.g., be located adjacent to) subsequently formed slot structures separating blocks of the electronic device 100 into one or more sub-blocks. The upper pillars 135, 137 in a row 107 may be horizontally offset (e.g., in each of the X-direction and the Y-direction) from the upper pillars 135, 137 in a neighboring (e.g., adjacent) row 107. For example, the first upper pillars 135 of a row 107 may be horizontally aligned (e.g., in the X-direction) with one another, and the second upper pillars 137 may be horizontally aligned (e.g., in the X-direction) with one another. In addition, the upper pillars 135, 137 of every fourth column 109 may be horizontally aligned (e.g., in the X-direction) with one another.

As shown in FIG. 1B, each of the upper pillars 135, 137 may be horizontally offset (e.g., in each of the X-direction and the Y-direction) from a center of the vertically underlying (e.g., in the Z-direction) pillars 110. In other words, each of the upper pillars 135, 137 may be horizontally offset in at least one (e.g., each) horizontal direction from a center of a respective pillar 110 without being centered over a respective pillar 110. In some embodiments, each of the first upper pillars 135 may be offset to an equal extent in the first horizontal direction (e.g., shifted left in the X-direction from the perspective of FIG. 1B) and in a second horizontal direction (e.g., shifted down in the Y-direction from the perspective of FIG. 1B), such that each of the first upper pillars 135 are aligned with one another in the columns 109. Similarly, each of the second upper pillars 137 may be offset to an equal extent in the first horizontal direction (e.g., shifted right in the X-direction from the perspective of FIG. 1B) and in the second horizontal direction (e.g., shifted up in the Y-direction from the perspective of FIG. 1B), such that each of the second upper pillars 137 are aligned with one another in the columns 109.

In other embodiments, at least some of the upper pillars 135, 137 are horizontally offset from the center of the underlying pillars 110, but to a lesser or greater extent than some of the other of the upper pillars 135, 137. In some such embodiments, at least some of the upper pillars 135, 137 are not concentric with the center of the underlying pillars 110, but a center of the upper pillars 135, 137 may be located closer to the center of the underlying pillars 110 than locations of the center of additional upper pillars 135, 137 to a center of underlying pillars 110.

Referring now to FIG. 1C, after forming the insulative material 134, portions of the insulative material 134 may be removed from within the upper pillars 135, 137 to form a recess. The recess may be filled with additional channel material to form a horizontally extending portion 136 of the channel material 130. The additional channel material may comprise the same material composition as the channel material 130.

As shown in FIG. 1C, a thickness $T_1$ (e.g., in the Z-direction) of the dielectric material 108 may be within a range from about 40 nm to about 200 nm, such as from about 40 nm to about 60 nm, from about 60 nm to about 80 nm, from about 80 nm to 100 nm, from about 100 nm to about 150 nm, or from about 150 nm to about 200 nm. In some embodiments, the thickness $T_1$ is about 60 nm. However, the disclosure is not so limited and the thickness $T_1$ may be different than that described above. A thickness $T_2$ of the etch stop material 125 may be within a range from about 10 nm to about 30 nm, such as from about 10 nm to about 20 nm, or from about 20 nm to about 30 nm. In some embodiments, the thickness $T_2$ is about 20 nm. However, the disclosure is not so limited and the thickness $T_2$ may be different than those described.

In addition, a thickness $T_3$ of the channel material 114 may be about the same as a thickness $T_4$ of the channel material 130. In other embodiments, the thickness $T_3$ of the channel material 114 is less than the thickness $T_4$ of the channel material 130. In yet other embodiments, the thickness $T_3$ of the channel material 114 is greater than the thickness $T_4$ of the channel material 130. In some embodiments, a thickness of the channel region (including the channel material 114, the channel material 130, and the conductive material 122) may be greater between the stack 101 and the other stack 105 (e.g., proximate the interdeck region 111) than at locations within the stack 101 and the other stack 105. The thickness $T_3$ and the thickness $T_4$ may each individually be within a range of from about 5 nm to about 30 nm, such as from about 5 nm to about 10 nm, from about 10 nm to about 20 nm, or from about 20 nm to about 30 nm.

An initial thickness $T_5$ (e.g., in the Z-direction) of the horizontally extending portion 136 of the channel material 130 may be within a range from about 30 nm to about 50 nm, such as from about 30 nm to about 40 nm, or from about 40 nm to about 50 nm. However, the disclosure is not so limited and the thickness $T_5$ may be different than those described.

With reference to FIG. 1D, after forming the horizontally extending portion 136 of the channel material 130, slots 133 may be formed through the other stack 105 and the stack 101. The slots 133 may be referred to herein as "replacement gate" slots. The slots 133 may be formed by removing portions of the materials of the other stack 105, the etch stop material 125, the dielectric material 108, and the stack 101. The materials of the other stack 105, the etch stop material 125, the dielectric material 108, and the stack 101 may, for example, be removed by one or more etch processes. In some embodiments, the slots 133 expose at a least a portion of the source 103. The electronic device 100 may include the slots 133 that are horizontally spaced from each other (e.g., in the X-direction) by a plurality of columns 109 (FIG. 1B) of the pillars 110 and the upper pillars 135, 137. The electronic device 100 may be divided into blocks 140 between horizontally neighboring (e.g., in the X-direction) slots 133. Although FIG. 1D illustrates only a portion of one block 140, it will be understood that the electronic device 100 may include several blocks 140. As described below, the blocks 140 may be divided into one or more sub-blocks.

With reference to FIG. 1E, after forming the slots 133, the other insulative structures 106 (FIG. 1D) of the stack 101 may be removed through the slots 133 as part of a so-called "replacement gate" or "gate last" process. By way of non-limiting example, the other insulative structures 106 may be removed by exposing the other insulative structures 106 to a wet etchant comprising one or more of phosphoric acid, sulfuric acid, hydrochloric acid, nitric acid, or another material. In some embodiments, the other insulative structures 106 are removed by exposing the other insulative structures 106 to a so-called "wet nitride strip" comprising a wet etchant comprising phosphoric acid. In some embodiments, the other insulative structures 106 of the stack 101 and of the other stack 105 may be removed simultaneously through the slots 133.

After removal of the other insulative structures 106, conductive structures 142 may be formed between the neighboring insulative structures 104 at locations corresponding to the locations of the other insulative structures 106 to form a stack 101 comprising tiers 144 of the insulative structures 104 and the conductive structures 142 and the other stack 105 comprising tiers 144 of the insulative structures 104 and additional conductive structures 145 (which may comprise the same material composition as the conductive structures 142). For clarity, the insulative structures 104 of the other stack 105 may be referred to here as additional insulative structures 104. The conductive structures 142 of the stack 101 may serve as local word line structures (e.g., local or word line plates). The additional conductive structures 145 of the other stack 105 may serve as select gate structures, such as select gate drain (SGD) structures.

The conductive structures 142 and the additional conductive structures 145 may each individually be formed of and include a conductive material. In some embodiments, the conductive structures 142 and the additional conductive structures 145 comprise tungsten. In other embodiments, the conductive structures 142 and the additional conductive structures 145 comprise conductively doped polysilicon.

In some embodiments, the conductive structures 142 may include a conductive liner material (not shown) around the conductive structures 142, such as between the conductive structures 142 and the insulative structures 104. In addition, the additional conductive structures 145 may include a conductive liner material (not shown) around the additional conductive structures 145, such as between the additional conductive structures 145 and the insulative structures 104. The conductive liner material may comprise, for example, a seed material from which the conductive structures 142 and additional conductive structures 145 may be formed. The conductive liner material may be formed of and include, for example, a metal (e.g., titanium, tantalum), a metal nitride (e.g., tungsten nitride, titanium nitride, tantalum nitride), or another material. In some embodiments, the conductive liner material comprises titanium nitride.

Formation of the conductive structures 142 may form strings 160 of memory cells 162. The memory cells 162 of the strings 160 may be located at intersections of the pillars 110 and the conductive structures 142, and may individually include a portion of one of the pillars 110 and a portion of one of the conductive structures 142. Vertically neighboring memory cells 162 of the strings 160 may be separated from each other by one of the insulative structures 104.

After forming the conductive structures 142 and the additional conductive structures 145, the slots 133 may be filled with a dielectric material 146. The dielectric material 146 may extend through the other stack 105 and the stack 101. Accordingly, the dielectric material 146 may physically separate neighboring (e.g., adjacent) blocks 140 of the electronic device 100. The dielectric material 146 may comprise one or more of the materials described above with reference to the insulative material 112. In some embodiments, the dielectric material 146 comprises substantially the same material composition as the insulative material 112. In some embodiments, the dielectric material 146 comprises silicon dioxide.

With continued reference to FIG. 1E, after filling the slots 133 with the dielectric material 146, additional slots 148 may be formed through the tiers 144 of the insulative structures 104 and the additional conductive structures 145 of the other stack 105. In some embodiments, the additional slots 148 are formed by sequentially removing the tiers 144 of the insulative structures 104 and the additional conductive structures 145. The portions of the insulative structures 104 and the additional conductive structures 145 may, for example, be removed by one or more etch processes. The additional slots 148 may segment the block 140 into sub-blocks 150, each defined within horizontal boundaries between neighboring additional slots 148.

In some embodiments, the additional slots 148 terminate within a lowermost one of the tiers 144 of the other stack 105. In some such embodiments, the additional conductive structure 145 of the lowermost tier 144 of the other stack 105 may be substantially continuous within the block 140. By way of comparison, the additional slots 148 may segment the additional conductive structures 145 of the tiers 144 of the other stack 105 (other than the lowermost tier 144) into different portions such that the additional conductive structures 145 are not substantially continuous within the block 140. Rather, such additional conductive structures 145 may be segmented by the additional slots 148.

In some embodiments, the lowermost additional conductive structure 145 may comprise a so-called "dummy" word line structure. In use and operation of the electronic device 100, a voltage may be applied to the lowermost additional conductive structure 145, which may facilitate an improved current flow through the channel material 130 horizontally proximate the lowermost additional conductive structure 145 and through the interdeck region 111. The continuous lowermost additional conductive structure 145 may facilitate application of the voltage proximate substantially all of the first upper pillars 135 and the second upper pillars 137 within the block 140. In addition, in some embodiments, uppermost conductive structures 142 of the stack 101 may comprise dummy word line structures. Similarly, application of a voltage to the uppermost conductive structures 142 may facilitate improved flow of current through the channel material 130 proximate the interdeck region 111.

The additional slots 148 may extend vertically over (e.g., in the Z-direction) portions of each of the pillars 110 neighboring the additional slots 148. The additional slots 148 may be sized and shaped to facilitate electrical isolation of the additional conductive structures 145 and may be physically spaced from the upper pillars 135, 137. In some embodiments, the additional slots 148 vertically overlie and are located within horizontal boundaries of underlying strings 160 of memory cells 162.

The additional slots 148 may exhibit a so-called "weave" pattern wherein the additional slots 148 are not defined by a substantially straight line (e.g., extending in the Y-direction). Rather, the additional slots 148 may be configured to extend between neighboring columns 109 (FIG. 1G) of the pillars 110 and the upper pillars 135, 137 and may exhibit a non-linear shape to at least partially conform to the layout (e.g., the shape) of the strings 160 of memory cells 162 and the upper pillars 135, 137, with a portion of the additional slots 148 vertically overlying a portion of some of the pillars 110. For example, the additional slots 148 may include a crest region (e.g., convex region) extending in a direction away from a horizontally neighboring (e.g., in the X-direction) pillar 110 and the upper pillars 135, 137 and may include a corresponding valley region (e.g., concave region) horizontally neighboring (e.g., in the X-direction) the crest region, as best shown in FIG. 1G.

The additional slots 148 may be located between the upper pillars 135, 137 that are horizontally offset in each of the X-direction and the Y-direction (e.g., that are not concentric) with corresponding strings 160 of memory cells 162 directly underneath the upper pillars 135, 137. In some embodiments, the additional slots 148 intervene between one of the columns 109 (FIG. 1G) of the first upper pillars 135 and one of the columns 109 of the second upper pillars 137. By forming the upper pillars 135, 137 neighboring (e.g., adjacent to) the additional slots 148, the additional slots 148 may be formed to have a greater horizontal dimension without being located too close to or removing portions of the upper pillars 135, 137. In addition, the weave pattern of the additional slots 148 and the horizontal offset (e.g., in each of the X-direction and the Y-direction) of the upper pillars 135, 137 may facilitate formation of a block 140 having a relatively smaller horizontal dimension between slots 133 compared to conventional electronic devices. For example, the additional slots of a conventional electronic device may be formed through some (e.g., a column) of upper pillar structures, reducing the total number of upper pillar structures that can be fit within a given horizontal dimension between neighboring slots.

Referring collectively to FIGS. 1F and 1G, after forming the additional slots 148, the additional slots 148 may be filled with a dielectric material 152. A cross-section of the electronic device 100 along the F-F line of FIG. 1G is shown in FIG. 1F. For clarity and ease of understanding the drawings and associated description, etch stop material 154 is absent in FIG. 1G. The dielectric material 152 may comprise one or more of the materials described above with reference to the dielectric material 146. In some embodiments, the dielectric material 152 comprises substantially the same material composition as the dielectric material 146. In some embodiments, the dielectric material 152 comprises silicon dioxide.

After forming the dielectric material 152 within the additional slots 148, dielectric material 152 located outside of the additional slots 148 may be removed, such as by subjecting the electronic device 100 to a CMP process. An etch stop material 154 may be formed over the electronic device 100. The etch stop material 154 may comprise one or more of the materials described above with reference to the etch stop material 125. In some embodiments, the etch stop material 154 comprises substantially the same material composition as the etch stop material 125. In some embodiments, the etch stop material 154 comprises a carbon-containing material (e.g., silicon carbon nitride (SiCN)).

As shown in FIG. 1F, openings 156 may be formed through the etch stop material 154 to expose an upper portion of the upper pillars 135, 137, such as at least an upper surface of the horizontally extending portions 136 of the channel material 130. In some embodiments, upper portions of the horizontally extending portion 136 may be removed such that an upper surface of the horizontally extending portion 136 is recessed relative to an upper surface of the liner material 128. In other embodiments, upper portions of each of the horizontally extending portion 136 and the liner material 128 may be recessed relative to an upper surface of the uppermost insulative structure 129. In additional embodiments, the openings 156 may be formed through the etch stop material 154, for example, without recessing the horizontally extending portion 136 and the liner material 128. In some such embodiments, subsequently formed conductive structures (e.g., interconnect structures) may be formed directly on an initial upper surface of the horizontally extending portion 136 of the channel material 130 exhibiting the initial thickness $T_5$ (FIG. 1C).

An outer dimension of the pillars 110 may be relatively larger than an outer dimension of the upper pillars 135, 137. For example, a dimension $D_1$ (e.g., a diameter) of the pillars 110 may be within a range from about 90 nm to about 150 nm, such as from about 90 nm to about 100 nm, from about 100 nm to about 110 nm, from about 110 nm to about 120 nm, from about 120 nm to about 130 nm, from about 130 nm to about 140 nm, or from about 140 nm to about 150 nm. In some embodiments, the dimension $D_1$ is about 120 nm. However, the disclosure is not so limited and the dimension $D_1$ may be different than those described. An outer dimension $D_2$ (e.g., a diameter) of a lower portion of the upper pillars 135, 137 may be within a range from about 40 nm to about 80 nm, such as from about 40 nm to about 50 nm, from about 50 nm to about 60 nm, from about 60 nm to about 70 nm, or from about 70 nm to about 80 nm. In some embodiments, the dimension $D_2$ may be within a range from about 50 nm to about 60 nm, such as about 55 nm. In addition, an outer dimension $D_3$ (e.g., a diameter) of an upper portion of the upper pillars 135, 137 may be within a range from about 60 nm to about 100 nm, such as from about 60 nm to about 70 nm, from about 70 nm to about 80 nm, from about 80 nm to about 90 nm, or from about 90 nm to about 100 nm. In some embodiments, the dimension $D_3$ is from about 55 nm to about 65 nm, such as about 60 nm. In some embodiments, the dimension $D_3$ is larger than the dimension $D_2$ and sidewalls of the upper pillars 135, 137 exhibit a tapered (e.g., angled) shape with respect to a major surface of the source 103. In some embodiments, the dimension $D_1$ of the pillars 110 is about twice as large as the dimension $D_3$. Horizontal (e.g., lateral) boundaries of the upper pillars 135, 137 may not extend beyond horizontal boundaries of the pillars 110. In other words, the dimension $D_3$ may be sized such that the upper pillars 135, 137 do not laterally extend beyond the horizontal boundary of the pillars 110.

A dimension $D_4$ (e.g., diameter) of an upper portion of the dielectric material 152 within additional slots 148 may be within a range from about 20 nm to about 100 nm, such as from about 20 nm to about 40 nm, from about 40 nm to about 60 nm, from about 60 nm to about 80 nm, or from about 80 nm to about 100 nm. In some embodiments, the dimension $D_4$ is about 35 nm. However, the disclosure is not so limited and the dimension $D_4$ may be different than those described. In some embodiments, the dimension $D_4$ is substantially uniform across a width (e.g., in the X-direction) of the dielectric material 152 within the additional slots 148. Accordingly, even though the additional slots 148 exhibit a weave shape with arcuate surfaces, the dimension $D_4$ may be substantially uniform. In some embodiments, the dimension $D_4$ of the dielectric material 152 within the additional slots 148 may be greater than a distance between horizontally neighboring strings 160 of memory cells 162. A dimension $D_5$ (e.g., diameter) of a lower portion of the dielectric material 152 within the additional slots 148 may be within a range from about 10 nm to about 40 nm, such as from about 10 nm to about 20 nm, from about 20 nm to about 30 nm, or from about 30 nm to about 40 nm. In some embodiments, the dimension $D_5$ is about 25 nm. However, the disclosure is not so limited and the dimension $D_5$ may be different than those described.

A dimension $D_6$ (e.g., distance) between a horizontal edge of the dielectric material 152 within the additional slots 148 and a nearest horizontal edge of the first upper pillars 135 may be within a range from about 15 nm to about 80 nm, such as from about 15 nm to about 25 nm, from about 25 nm to about 35 nm, from about 35 nm to about 45 nm, from about 45 nm to about 55 nm, from about 55 nm to about 65 nm, or from about 65 nm to about 80 nm. In some embodiments, the dimension $D_6$ is within a range from about 40 nm to about 45 nm. However, the disclosure is not so limited and the dimension $D_6$ may be different than those described.

Referring collectively to FIGS. 1H and 1I, after forming the openings 156 (FIG. 1F), interconnect structures 158 (e.g., digit line contacts, bit line contacts) may be formed over (e.g., directly on) and in electrical communication with the channel material 130 of the upper pillars 135, 137. In addition, conductive lines 164 may be formed over (e.g., directly on) and in electrical communication with the interconnect structures 158. The conductive lines 164 may also be formed over a dielectric material (not shown) overlying the etch stop material 154 and the interconnect structures 158 may be formed within openings of the dielectric material. A cross-section of the electronic device 100 along the H-H line of FIG. 1I is shown in FIG. 1H. For clarity and ease of understanding the drawings and associated description, the etch stop material 154 is absent in FIG. 1I. The interconnect structures 158 (shown in dashed lines in FIG. 1I for clarity) may be electrically coupled to conductive lines 164 (e.g., digit lines, bit lines, data lines) configured for selectively coupling to the strings 160 of the memory cells 162.

As shown in FIG. 1H, the interconnect structures 158 are located directly between the channel material 130 of the upper pillars 135, 137 and the conductive lines 164, such that no other material intervenes therebetween. In other words, each of the interconnect structures 158 vertically intervenes between (e.g., directly between and directly contacting) one of the upper pillars 135, 137 and a respective conductive line 164 without additional contact structures being located therebetween. Accordingly, the upper pillars 135, 137 (e.g., device structures) are located laterally adjacent to (e.g., at an elevational level of) the additional conductive structures 145 of the other stack 105, and the upper pillars 135, 137 are directly connected to the conductive lines 164 only through the interconnect structures 158. For example, the upper pillars 135, 137 may include a lower portion laterally adjacent to the additional conductive structures 145 of the other stack 105 and an upper portion located above an uppermost additional conductive structure 145, such as laterally adjacent to the uppermost insulative structure 129. The methods of the disclosure, therefore, may reduce or eliminate process acts that are otherwise utilized in many conventional electronic devices to form additional contact structures (e.g., between the upper pillars 135, 137 and the interconnect structures 158) so as to simplify manufacturing processes and reduce complexity of the electronic device 100. FIG. 1H shows a conductive plug structure (e.g., conductive material 122) between the channel material 114 and the additional channel material (e.g., a horizontally extending portion 136 of the channel material 130), wherein the channel material 114, the conductive plug structure, and the additional channel material comprises a continuous portion of a conductive material extending from the source tier 103 to a lower surface of the interconnect structures 158.

The interconnect structures 158 may be formed of and include a conductive material, such as one or more of the materials described above with reference to the conductive structures 142. In some embodiments, the interconnect structures 158 comprise substantially the same material composition as the conductive structures 142. In some embodiments, the interconnect structures 158 comprise tungsten. Each of the interconnect structures 158 may individually include a substantially homogeneous distribution or a substantially heterogeneous distribution of at least one conductive material. In some embodiments, each of the interconnect structures 158 is substantially homogeneous (e.g., includes a single material).

The conductive lines 164 may be formed of and include a conductive material. In some embodiments, the conductive lines 164 comprise tungsten. The conductive lines 164 may or may not include substantially the same material composition as the interconnect structures 158 and/or the conductive structures 142.

As shown in FIG. 1I, each of the pillars 110 and the upper pillars 135, 137 may individually exhibit a substantially circular cross-sectional shape. In some embodiments, the interconnect structures 158 exhibit a substantially circular cross-sectional shape (not shown). In other embodiments, the interconnect structures 158 exhibit a different cross-sectional shape than one or more (e.g., each) of the pillars 110 and the upper pillars 135, 137. For example, the interconnect structures 158 may exhibit a lateral dimension (e.g., a length, a diameter) in a first horizontal direction that is larger than another lateral dimension (e.g., a width, a diameter) in a second horizontal direction. In other words, at least some of the interconnect structures 158 exhibit a substantially elliptical (e.g., oblong, oval) cross-sectional shape, as shown in FIG. 1I. For example, the interconnect structures 158 may exhibit an oblong shape and may be elongated in one horizontal direction (e.g., the X-direction), corresponding to the horizontal direction in which the conductive lines 164 extend. In other embodiments, at least some of the pillars 110 and/or the upper pillars 135, 137 individually exhibit a substantially elliptical cross-sectional shape (not shown). Accordingly, one or more of the pillars 110, the upper pillars 135, 137, and the interconnect structures 158 individually exhibits a substantially circular cross-sectional shape or a substantially elliptical cross-sectional shape. However, the disclosure is not so limited, and additional configurations may be contemplated. For example, one or more of the pillars 110, the upper pillars 135, 137, and the interconnect structures 158 may individually exhibit a substantially rectangular cross-sectional shape (e.g., a substantially square cross-sectional shape).

A dimension of the interconnect structures 158 may be relatively larger than a dimension of the upper pillars 135, 137 in at least one horizontal direction (e.g., the X-direction). For example, a dimension $D_7$ (e.g., a diameter) of the interconnect structures 158 may be within a range from about 10 nm to about 150 nm, such as from about 10 nm to about 30 nm, from about 30 nm to about 60 nm, from about 60 nm to about 80 nm, from about 80 nm to about 100 nm, from about 100 nm to about 120 nm, or from about 120 nm to about 150 nm. In some embodiments, the dimension $D_7$ is about 120 nm. However, the disclosure is not so limited and the dimension $D_7$ may be different than those described. In addition, the dimension $D_7$ of the interconnect structures 158 may be about the same as the dimension $D_1$ of the pillars 110 (e.g., a corresponding string 160 of the memory cells 162). In other embodiments, the dimension $D_7$ of the interconnect structures 158 is less than the dimension $D_1$ of the pillars 110. In yet other embodiments, the dimension $D_7$ of the interconnect structures 158 is greater than the dimension $D_1$ of the pillars 110, such that portions of the interconnect structures 158 extend beyond a horizontal boundary of the pillars 110 in at least one horizontal direction (e.g., the X-direction).

The elongated shape of the interconnect structures 158 may provide an increased surface area available for contact with the subsequently formed conductive structures (e.g., the conductive lines 164). For clarity and ease of understanding the drawings and associated description, only two conductive lines 164 (shown in broken lines) are illustrated in FIG. 1I. However, it will be understood that one of the conductive lines 164 is associated with each of the interconnect structures 158 and a corresponding pillar 110. In addition, the larger cross-sectional area of the interconnect structures 158 in the horizontal direction in which the conductive lines 164 extend (e.g., the X-direction) provides a larger contact area and, thus, provides a larger margin for alignment between the interconnect structures 158 and the conductive lines 164. Further, the elongated shape of the interconnect structures 158 adjacent to the conductive lines 164 may provide a reduced resistivity (e.g., electrical resistance levels) of the conductive materials thereof without significantly affecting conductivity.

FIG. 1J illustrates an enlarged portion of the top-down view of FIG. 1I. For clarity and ease of understanding the drawings and associated description, surrounding materials including the uppermost insulative structure 129 and the etch stop material 154 are absent from FIG. 1J. As shown in FIG. 1J, the central axis 180 of one of the second upper pillars 137 may be horizontally offset (e.g., in each of the X-direction and the Y-direction) relative to the central axis 181 of the underlying pillar 110. For example, the central axis 180 of each of the second upper pillars 137 may be located at an acute angle α (e.g., a first acute angle) defined by the intersection of lines 174, 176 extending through the central axis 180 of one of the second upper pillars 137 and the central axis 181 of the underlying pillar 110, respectively, with the line 176 corresponding to the X-direction and line 178 corresponding to the Y-direction. Accordingly, each of the upper pillars 135, 137 is horizontally offset (e.g., in each of two horizontal directions) from a center of an underlying pillar 110, without the upper pillars 135, 137 being horizontally offset in a single horizontal direction (e.g., the X-direction) utilized in many conventional electronic devices. Providing the upper pillars 135, 137 that are horizontally offset in each of two horizontal directions (e.g., at the acute angle α) may facilitate alignment between the interconnect structures 158 and the conductive lines 164 without the need to form additional contact structures between the upper pillars 135, 137 and the interconnect structures 158.

By way of non-limiting example, the acute angle α of the central axis 180 may be within a range from about 30° to about 60° (e.g., about 45°) with respect to the X-axis, as indicated by the line 176, of the central axis 181 of the underlying pillar 110. However, the disclosure is not so limited and the central axis 180 may extend at an angle with respect to the X-axis different than those described above. In other words, the central axis 180 of each of the second upper pillars 137 is shifted in each of the X-direction and the Y-direction relative to the central axis 181 of the underlying pillar 110. For simplicity, the location of a single upper pillar (e.g., a single second upper pillar 137) is illustrated in FIG. 1J, but it will be understood by one of ordinary skill in the art that the illustration applies to formation of the first upper pillars 135 (FIG. 1I) such the central axis 180 of each of the first upper pillars 135 may be located at the acute angle α (e.g., a second acute angle) with reference to the X-axis of the central axis 181 of the underlying pillar 110. Accordingly, the first upper pillars 135 may be shifted in a direction away from the second upper pillars 137 in each of the first horizontal direction (e.g., the X-direction) and the second horizontal direction (e.g., the Y-direction).

As described above, the lateral boundaries of the first upper pillars 135 (FIG. 1I) and the second upper pillars 137 may not extend beyond horizontal boundaries of the pillars 110. The lateral boundaries of the interconnect structures 158 are offset (e.g., positioned off-center or staggered) relative to the outer side surfaces of the pillars 110. In other words, the interconnect structures 158 may extend across, or beyond, a full lateral extent of the upper surfaces of the pillars 110. In some embodiments, portions of the interconnect structures 158 may extend beyond lateral boundaries of the pillars 110 on one or more sides thereof. Since the central axis 180 of each of the second upper pillars 137 is offset in the first horizontal direction (e.g., shifted right in the X-direction from the perspective of FIG. 1J) relative to the central axis 181 and in the second horizontal direction (e.g., shifted up in the Y-direction from the perspective of FIG. 1J) relative to the central axis 181, portions of the interconnect structures 158 may extend beyond the horizontal boundaries of the underlying pillar 110 on at least one side (e.g., the right side). Similarly, since the central axis 180 of each of the first upper pillars 135 (FIG. 1I) is offset in the first horizontal direction (e.g., shifted left in the X-direction) relative to the central axis 181 and in the second horizontal direction (e.g., shifted down in the Y-direction) relative to the central axis 181, portions of the interconnect structures 158 may extend beyond the lateral boundaries of the underlying pillar 110 on at least one other side (e.g., the left side). Accordingly, the central axis 180 of each of the upper pillars 135, 137 may be located in one of four quadrants defined by the X-axis, as indicated by the line 176, and the Y-axis, as indicated by the line 178, of the central axis 181 of the underlying pillar 110, without being located directly along either the X-axis or the Y-axis of the central axis 181 of the underlying pillar 110.

As described above, the additional slots 148 and the horizontal offset of the first upper pillars 135 (FIG. 1I) and the second upper pillars 137 in each of the X-direction and the Y-direction may facilitate improved operation of the electronic device 100. For example, the offset of the first upper pillars 135 in the first horizontal direction (e.g., shifted left in the X-direction) and away from the additional slots 148, in combination with the offset of the second upper pillars 137 in the first horizontal direction (e.g., shifted right in the X-direction) and away from the additional slots 148 on an opposing side thereof, may facilitate the additional slots 148 being formed to have a greater horizontal dimension without being located too close or removing portions of the upper pillars 135, 137. In addition, the offset of the first upper pillars 135 in the second horizontal direction (e.g., shifted down in the Y-direction), in combination with the offset of the second upper pillars 137 in the second horizontal direction (e.g., shifted up in the Y-direction), may facilitate direct connection of the interconnect structures 158 to the conductive lines 164 within individual sub-blocks 150 of the electronic device 100, without the need to form additional contact structures (e.g., between the upper pillars 135, 137 and the interconnect structures 158).

In addition, since the interconnect structures 158, including the elongated shape thereof, are formed directly between the upper pillars 135, 137 and the conductive lines 164, the interconnect structures 158 may be formed to exhibit improved electrical properties compared to interconnect structures formed adjacent to (e.g., on or over) additional contact structures located adjacent to (e.g., on or over) upper pillars of conventional electronic devices. Further, the interconnect structures 158 may be positioned and configured to substantially reduce capacitance between horizontally neighboring conductive lines 164, resulting in improved electrical conductivity (and a lower electrical resistance) during use and operation of the electronic device 100 compared to conventional electronic devices.

Figure 1K:
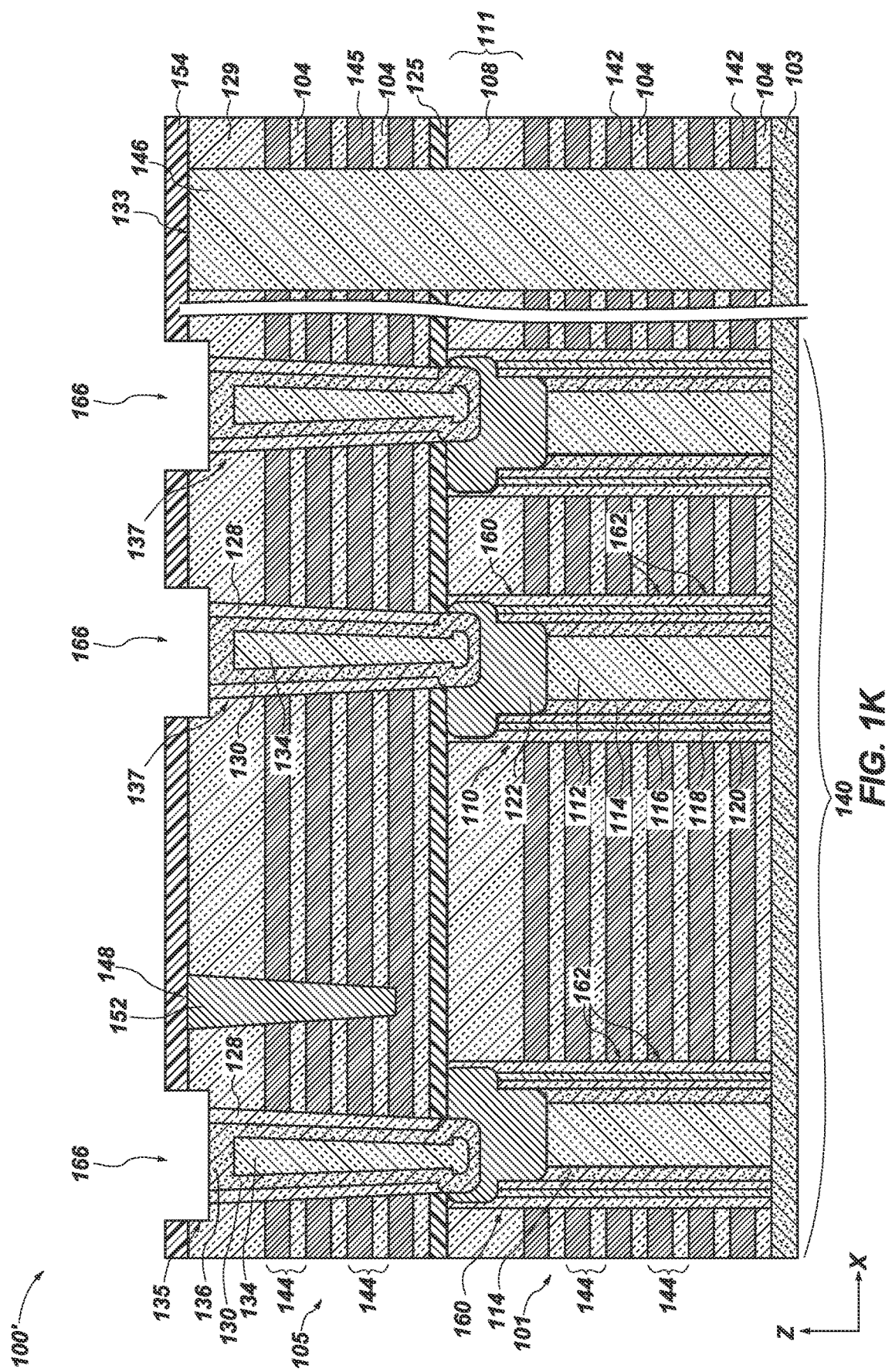
FIGS. 1K through 1N are simplified partial cross-sectional views (FIGS. 1K and 1L) and simplified partial top-down views (FIGS. 1M and 1N) illustrating a method of forming an electronic device, in accordance with additional embodiments of the disclosure, where the cross-sectional view of FIG. 1L is taken along the L-L line in FIG. 1M.
Figure 1L:
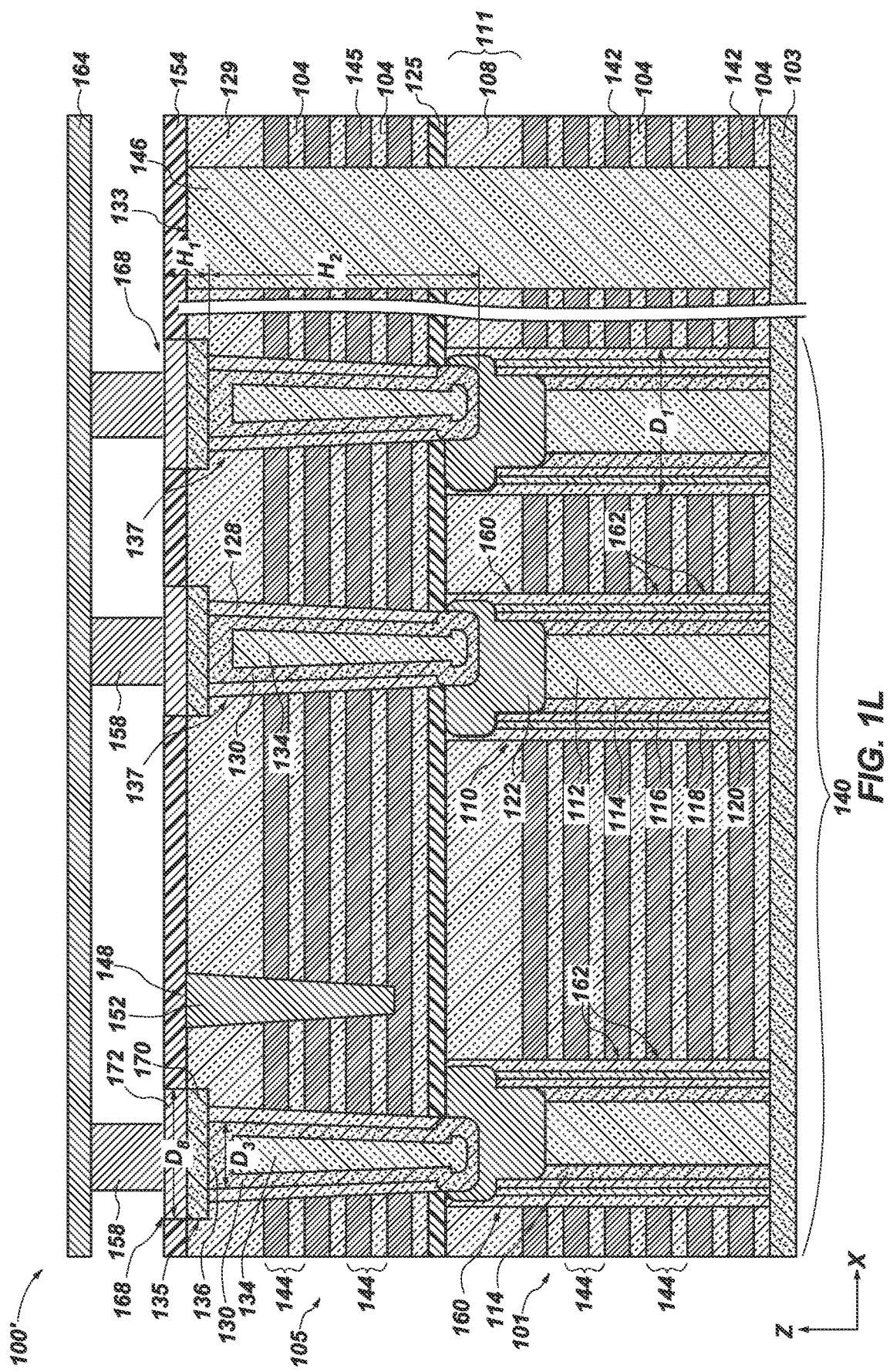
Figure 1M:
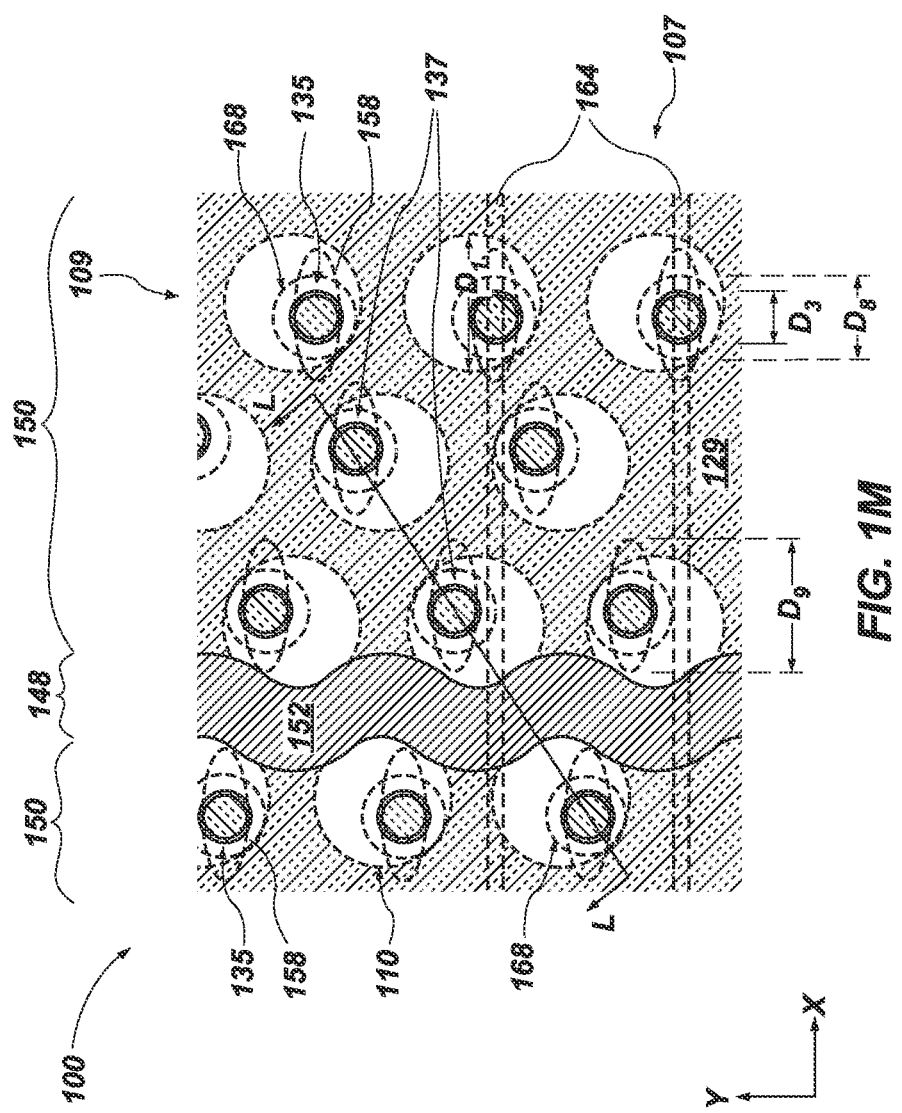
Figure 1N:
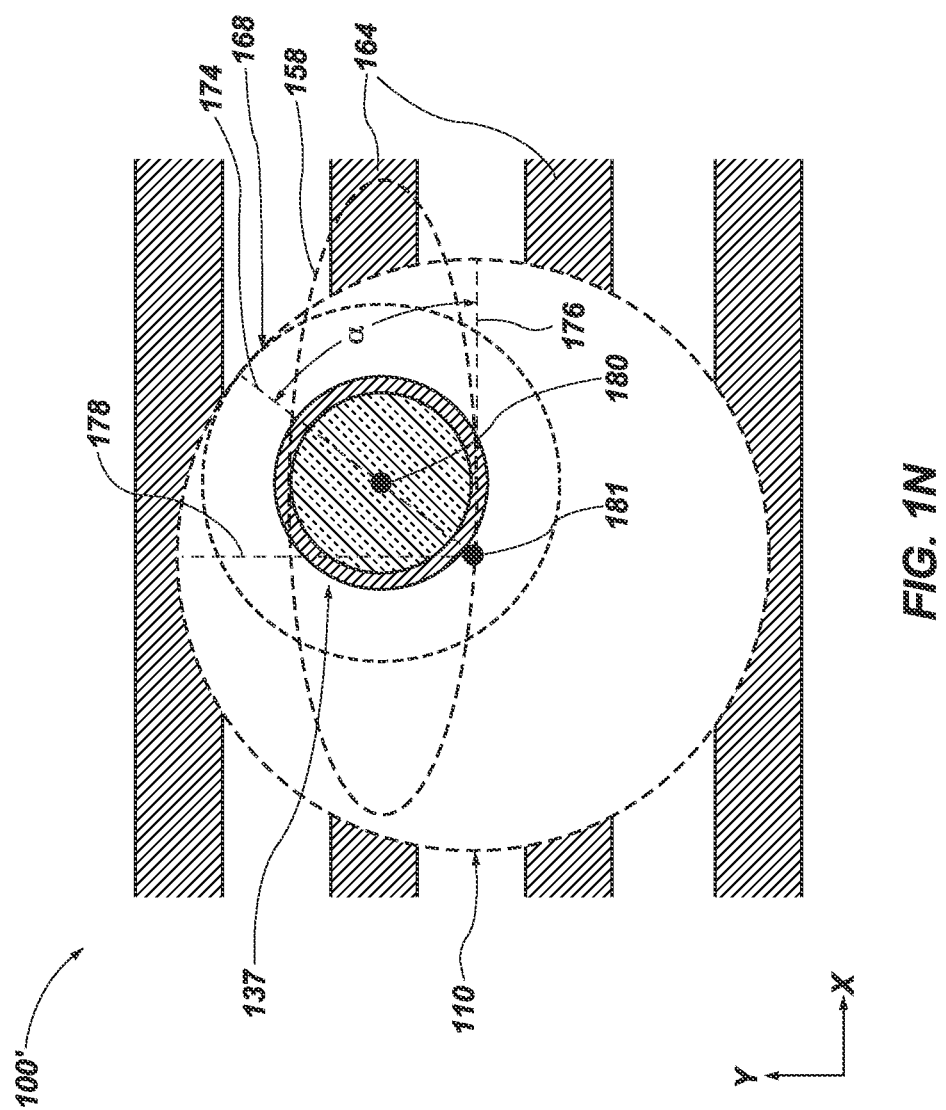

While FIGS. 1A through 1J illustrate formation of the electronic device 100 including the interconnect structures 158 extending between (e.g., directly between) the upper pillars 135, 137 and the conductive lines 164, at least some (e.g., each) of the upper pillars 135, 137 may exhibit a "T" shape including an upper portion thereof that is relatively wider than a lower portion thereof. For example, the upper pillars 135, 137 may be formed to include a relatively wider portion 168 (FIG. 1L) within or adjacent to (e.g., over) the other stack 105 of an electronic device 100'. A transition between the relatively wider portion 168 of the upper pillars 135, 137 and the lower portion thereof may exhibit an abrupt topographical change (e.g., a lip), as shown in FIG. 1L. A method of forming the upper pillars 135, 137 within or adjacent to the other stack 105 (e.g., within the uppermost insulative structure 129) of the electronic device 100' is shown in FIGS. 1K through 1N, of which FIGS. 1K and 1L are simplified partial cross-sectional views, and FIGS. 1M and 1N are simplified partial top-down views. The cross-sectional view of FIG. 1L is taken along the L-L line in FIG. 1M. FIG. 1N is an enlargement of a portion of FIG. 1M. As shown, for example, in FIG. 1L, the interconnect structures 158 extending between the upper pillars 135, 137 and the conductive lines 164 may be formed adjacent to (e.g., on, directly on) the relatively wider portion 168 (FIG. 1L) of the upper pillars 135, 137. The relatively wider portion 168 of the upper pillars 135, 137, if present, may be formed over the lower portion thereof as described above for FIGS. 1A through 1J. The relatively wider portion 168 may form a so-called "T-shape" in cross-section and provide an increased surface area available for subsequently formed conductive structures (e.g., the interconnect structures 158).

With reference to FIG. 1K, openings 166 may be formed through the etch stop material 154 to expose an upper portion of the upper pillars 135, 137, such as at least an upper surface of the horizontally extending portions 136 of the channel material 130. In some embodiments, upper portions of each of the horizontally extending portion 136 and the liner material 128, as well as portions of the uppermost insulative structure 129, may be removed such that upper surfaces of the horizontally extending portion 136 and the liner material 128 are recessed relative to an upper surface of remaining portions of the uppermost insulative structure 129. A dimension (e.g., diameter) of the openings 166 may be relatively larger than a dimension of the openings 156 of the embodiment of FIG. 1F in order to facilitate formation of the relatively wider portion 168 of the upper pillars 135, 137.

Referring collectively to FIGS. 1L and 1M, after forming the openings 166 (FIG. 1K), the relatively wider portion 168 of the upper pillars 135, 137 may be formed over (e.g., directly on) the channel material 130 of the upper pillars 135, 137. The interconnect structures 158 may be formed over (e.g., directly on) the relatively wider portion 168 of the upper pillars 135, 137, and the conductive lines 164 may be formed over (e.g., directly on) the interconnect structures 158. A cross-section of the electronic device 100 along the L-L line of FIG. 1M is shown in FIG. 1L. For clarity and ease of understanding the drawings and associated description, the etch stop material 154 is absent in FIG. 1M. The relatively wider portion 168 (shown in dashed lines in FIG. 1M for clarity) of the upper pillars 135, 137 may be electrically coupled to the interconnect structures 158. The interconnect structures 158 (also shown in dashed lines in FIG. 1M for clarity) may be electrically coupled to the conductive lines 164.

The relatively wider portion 168 of the upper pillars 135, 137 may be formed of at least one conductive material that includes a substantially homogeneous distribution or a substantially heterogeneous distribution of the conductive material. In some embodiments, a first material 170 of the relatively wider portion 168 of the upper pillars 135, 137 may be formed adjacent to (e.g., directly on) an upper surface of the horizontally extending portion 136 of the channel material 130, and a second material 172 of the relatively wider portion 168 may be formed adjacent to (e.g., directly on) an upper surface of the first material 170. The first material 170 may comprise one or more of the materials described above with reference to the channel material 114 and the channel material 130. In some embodiments, the first material 170 may be formed of and include, but is not limited to, polysilicon. The second material 172 may be formed of and include a conductive material, such as one or more of the materials described above with reference to the conductive structures 142. In some embodiments, the second material 172 comprises tungsten. The second material 172 may be formed adjacent (e.g., directly adjacent) to and in contact with the first material 170, forming the relatively wider portion 168 of the upper pillars 135, 137. In other embodiments, the relatively wider portion 168 is substantially homogeneous (e.g., includes a single material).

A thickness (e.g., in the Z-direction) of the first material 170 may, for example, be within a range from about 10 nm to about 30 nm (e.g., about 20 nm). A thickness of the second material 172 may be within a range from about 40 nm to about 200 nm, such as from about 40 nm to about 80 nm, from about 80 nm to about 120 nm, from about 120 nm to about 160 nm, or from about 160 nm to about 200 nm. A height $H_1$ of the relatively wider portion 168 (e.g., a combined height of the first material 170 and the second material 172) of the upper pillars 135, 137 may, for example, be within a range from about 60 nm to about 220 nm, such as from about 60 nm to about 100 nm, from about 100 nm to about 140 nm, from about 140 nm to about 180 nm, or from about 180 nm to about 220 nm. In some embodiments, the height $H_1$ of the relatively wider portion 168 of the upper pillars 135, 137 may be substantially equal to or relatively smaller than the height $H_2$ of the lower portion thereof. In other embodiments (not shown), the height $H_1$ of the relatively wider portion 168 of the upper pillars 135, 137 may be relatively larger than a height $H_2$ of the lower portion thereof. By way of non-limiting example, a ratio of the height $H_1$ of the relatively wider portion 168 of the upper pillars 135, 137 to the height $H_2$ of the lower portion thereof may be within a range of from about 1:4 to about 4:1.

As shown in FIG. 1L, the interconnect structures 158 are located directly between the relatively wider portion 168 (e.g., the second material 172) of the upper pillars 135, 137 and the conductive lines 164, such that no other material intervenes therebetween. As in the previous embodiment, each of the interconnect structures 158 vertically intervenes between one of the upper pillars 135, 137 and a respective conductive line 164 without additional contact structures being located therebetween. Accordingly, the upper pillars 135, 137 (e.g., device structures), including the relatively wider portion 168 and the lower portion thereof, are located laterally adjacent to (e.g., at an elevational level of) the additional conductive structures 145 of the other stack 105, and the upper pillars 135, 137 are directly connected to the conductive lines 164 only through the interconnect structures 158. The methods of the disclosure may, therefore, reduce or eliminate process acts that are otherwise utilized in many conventional electronic devices to form additional contact structures (e.g., between the relatively wider portion 168 of the upper pillars 135, 137 and the interconnect structures 158) so as to simplify manufacturing processes and reduce complexity of the electronic device 100'.

The relatively wider portion 168 of the upper pillars 135, 137 may be located above an uppermost additional conductive structure 145 and the lower portion of the upper pillars 135, 137 may be located laterally adjacent to at least one of the additional conductive structures 145. In some embodiments, portions of the relatively wider portion 168 of the upper pillars 135, 137 (e.g., the first material 170) may be embedded within the uppermost insulative structure 129 and additional portions of the relatively wider portion 168 (e.g., the second material 172) may be laterally adjacent to the etch stop material 154, although other configurations of the relatively wider portion 168 relative to surrounding materials may be contemplated, so long as the relatively wider portion 168 is directly between the lower portion thereof and the interconnect structures 158. In some embodiments, upper surfaces of the relatively wider portion 168 are substantially coplanar with an upper surface of the etch stop material 154, as shown in FIG. 1L. In other embodiments, the upper surfaces of the relatively wider portion 168 of at least some of the upper pillars 135, 137 may be elevated above or, alternatively, recessed below the upper surface of the etch stop material 154.

A dimension of the relatively wider portion 168 of the upper pillars 135, 137 may be relatively larger than a dimension of the lower portion thereof. For example, a dimension $D_8$ (e.g., a diameter) of the relatively wider portion 168 may be within a range from about 40 nm to about 120 nm, such as from about 40 nm to about 50 nm, from about 50 nm to about 60 nm, from about 60 nm to about 70 nm, from about 70 nm to about 80 nm, from about 80 nm to about 90 nm, from about 90 nm to about 100 nm, from about 100 nm to about 110 nm, or from about 110 nm to about 120 nm. In some embodiments, the dimension $D_8$ is about 80 nm. However, the disclosure is not so limited and the dimension $D_8$ may be different than those described. In some embodiments, the dimension $D_8$ is larger than the dimension $D_3$ of respective lower portions of the upper pillars 135, 137, forming a so-called "T-shape" cross-sectional shape. In other words, a critical dimension (e.g., a diameter) of the relatively wider portion 168 of the upper pillars 135, 137 is relatively greater than a critical dimension (e.g., a diameter) of the lower portions thereof, as shown in FIG. 1L. In addition, the dimension $D_8$ may be equal to or smaller than the dimension $D_1$ of the pillars 110. Accordingly, horizontal (e.g., lateral) boundaries of the relatively wider portion 168 of the upper pillars 135, 137 may not extend beyond horizontal boundaries of the pillars 110. In other words, the dimension $D_8$ may be sized such that the relatively wider portion 168 does not laterally extend beyond the horizontal boundary of the pillars 110. As described above, the lateral boundaries of the interconnect structures 158 may be offset (e.g., positioned off-center or staggered) relative to the outer side surfaces of the pillars 110. In other words, portions of the interconnect structures 158 may extend across, or beyond, a full lateral extent of the upper surfaces of the pillars 110.

As shown in FIG. 1M, each of the pillars 110 and the upper pillars 135, 137, including the relatively wider portion 168 and the lower portions thereof, may individually exhibit a substantially circular cross-sectional shape, and the interconnect structures 158 may exhibit a substantially elliptical (e.g., oblong, oval) cross-sectional shape. In other embodiments, the relatively wider portion 168 of the upper pillars 135, 137 may exhibit a substantially elliptical cross-sectional shape, similar to that of the interconnect structures 158. The elongated shape of the relatively wider portion 168, if present, may provide an increased surface area available for contact with subsequently formed conductive structures (e.g., the interconnect structures 158). The larger cross-sectional area of the relatively wider portion 168 of the upper pillars 135, 137 provides a larger contact area and, thus, provides a larger margin for alignment between the relatively wider portion 168 and the interconnect structures 158. Further, the elongated shape of the interconnect structures 158 adjacent to the conductive lines 164 may provide a reduced resistivity (e.g., electrical resistance levels) of the conductive materials thereof without significantly affecting conductivity.

A dimension of the interconnect structures 158 of the electronic device 100' may be relatively larger than a dimension of the upper pillars 135, 137 in at least one horizontal direction (e.g., the X-direction), as in the previous embodiment. For example, a dimension $D_9$ (e.g., a diameter) of the interconnect structures 158 of the electronic device 100' may be similar to that of the dimension $D_7$ of the interconnect structures 158 described with reference to the embodiment of FIG. 1I. In addition, the dimension $D_9$ of the interconnect structures 158 may be greater than the dimension $D_8$ of the relatively wider portion 168 of the upper pillars 135, 137, such that portions of the interconnect structures 158 extend beyond a horizontal boundary of the relatively wider portion 168 in at least one horizontal direction (e.g., the X-direction). For clarity and ease of understanding, the drawings and associated description, only two conductive lines 164 (shown in broken lines) are illustrated in FIG. 1M. However, it will be understood that one of the conductive lines 164 is associated with each of the interconnect structures 158.

FIG. 1N illustrates an enlarged portion of the top-down view of FIG. 1M. For clarity and ease of understanding, drawings and associated description, surrounding materials including the uppermost insulative structure 129 and the etch stop material 154 are absent from FIG. 1N. The central axis 180 of each of the first upper pillars 135 (FIG. 1M) and the second upper pillars 137 may be horizontally offset (e.g., in each of the X-direction and the Y-direction) relative to the central axis 181 of the underlying pillar 110, as in the embodiment of FIG. 1J. For example, the central axis 180 of each of the second upper pillars 137 may be located at the acute angle α defined by the intersection of lines 174, 176 extending through the central axis 180 of one of the second upper pillars 137 and the central axis 181 of the underlying pillar 110, respectively, with the line 176 corresponding to the X-direction and the line 178 corresponding to the Y-direction. The acute angle α may, for example, be within a range from about 30° to about 60° (e.g., about 45°) with respect to the X-axis, as indicated by the line 176, of the central axis 181 of the underlying pillar 110. Similarly, the central axis 180 of each of the first upper pillars 135 (FIG. 1M) may be located at the acute angle α with reference to the central axis 181 of the underlying pillar 110. Accordingly, each of the upper pillars 135, 137 including the relatively wider portion 168 thereof is horizontally offset (e.g., in each of two horizontal directions) from a center of an underlying pillar 110, without the upper pillars 135, 137 being horizontally offset in a single horizontal direction (e.g., the X-direction) utilized in many conventional electronic devices. Providing the upper pillars 135, 137 that are horizontally offset in each of two horizontal directions (e.g., at the acute angle α) may facilitate alignment between the interconnect structures 158 and the conductive lines 164 without the need to form additional contact structures between the relatively wider portion 168 of the upper pillars 135, 137 and the interconnect structures 158.

As discussed above, the lateral boundaries of the relatively wider portion 168 of each of the first upper pillars 135 (FIG. 1M) and the second upper pillars 137 may not extend beyond horizontal boundaries of the pillars 110. The lateral boundaries of the interconnect structures 158 are offset (e.g., positioned off-center or staggered) relative to the outer side surfaces of the pillars 110. In other words, the interconnect structures 158 may extend across, or beyond, a full lateral extent of each of the relatively wider portion 168 of the upper pillars 135, 137 and the upper surfaces of the pillars 110, such that portions of the interconnect structures 158 may extend beyond the lateral boundaries of the relatively wider portion 168 of the second upper pillars 137, as well as beyond the lateral boundaries of the underlying pillar 110 on at least one side (e.g., the right side). Similarly, the interconnect structures 158 may extend beyond the lateral boundaries of the relatively wider portion 168 of the first upper pillars 135, as well as beyond the lateral boundaries of the underlying pillar 110 on at least one other side (e.g., the left side). Accordingly, the central axis 180 of each of the upper pillars 135, 137 may be located in one of four quadrants defined by the X-axis, as indicated by the line 176, and the Y-axis, as indicated by the line 178, of the central axis 181 of the underlying pillar 110, without being located directly along either the X-axis or the Y-axis of the central axis 181 of the underlying pillar 110.

Although FIG. 1A through FIG. 1N have been described and illustrated as including memory cells 162 having a particular structure and configuration, the disclosure is not so limited. In some embodiments, the memory cells 162 may comprise so-called "MONOS" (metal-oxide-nitride-oxide-semiconductor) memory cells. In additional embodiments, the memory cells 162 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In other embodiments, the memory cells 162 comprise so-called "floating gate" memory cells including floating gates (e.g., metallic floating gates) as charge storage structures. The floating gates may horizontally intervene between central structures of the strings 160 and the conductive structures 142.

Figure 2:
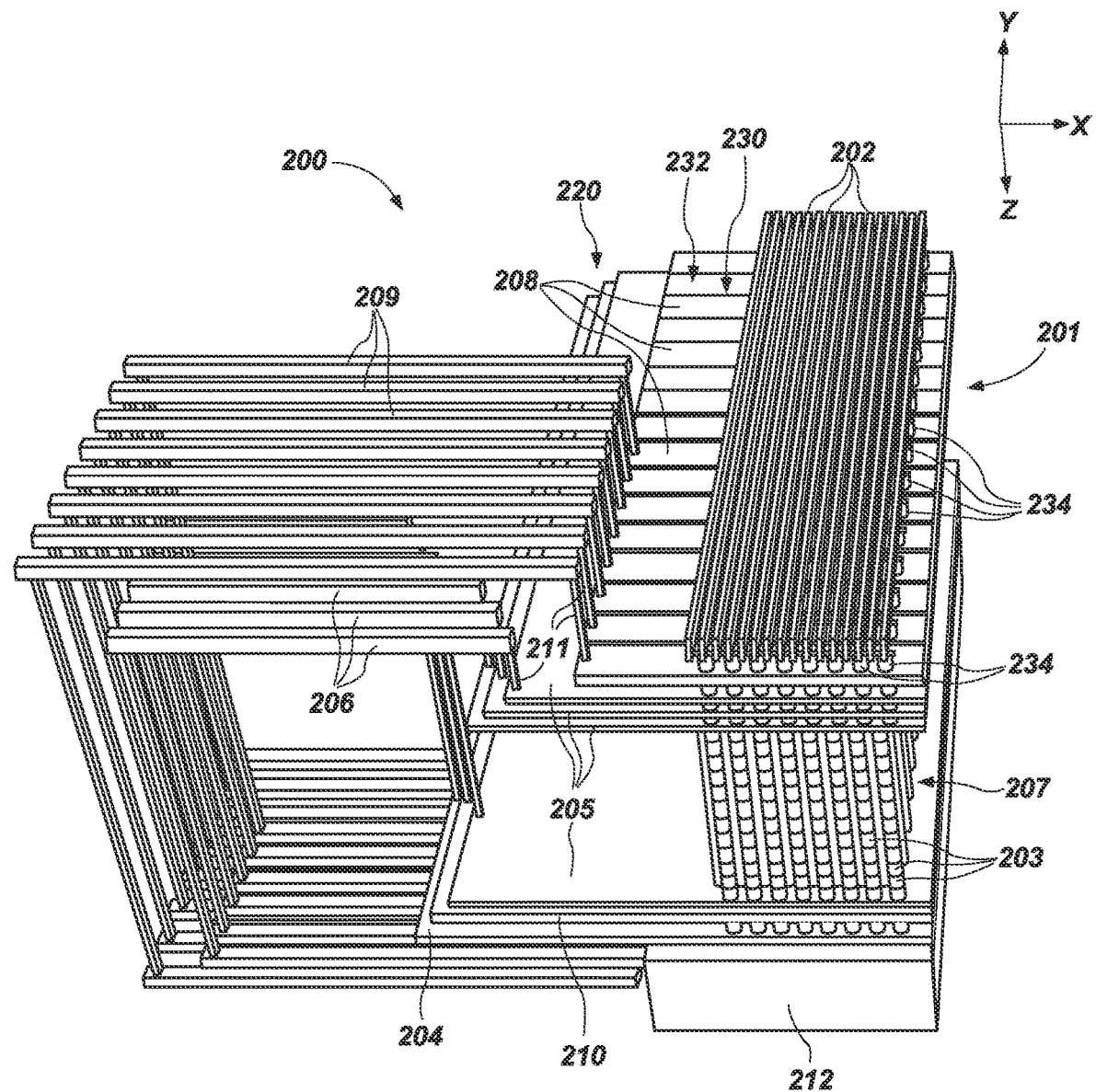
FIG. 2 is a partial cutaway perspective view of an electronic device, in accordance with embodiments of the disclosure.

FIG. 2 illustrates a partial cutaway perspective view of a portion of an electronic device 200 (e.g., a microelectronic device, a memory device, such as a 3D NAND Flash memory device) including one or more electronic device structures 201 (e.g., a microelectronic device structure). The electronic device 200 may include structures substantially similar to the electronic devices 100, 100' previously described with reference to FIGS. 1A through 1J and FIGS. 1K through 1N. As shown in FIG. 2, the electronic device structure 201 of the electronic device 200 may include a staircase structure 220 defining contact regions for connecting interconnect lines 206 to conductive structures 205 (e.g., corresponding to the conductive structures 142 (FIG. 1H, FIG. 1L)). The microelectronic device structure 201 may include vertical strings 207 (e.g., corresponding to the strings 160 (FIG. 1H, FIG. 1L)) of memory cells 203 (e.g., corresponding to the memory cells 162 (FIG. 1H, FIG. 1L)) that are coupled to each other in series. The vertical strings 207 may extend vertically (e.g., in the Z-direction) and orthogonally to conductive lines and the conductive structures 205, such as data lines 202 (e.g., corresponding to the conductive lines 164 (FIG. 1H, FIG. 1L)), a source tier 204 (e.g., corresponding to the source 103 (FIG. 1H, FIG. 1L)), the conductive structures 205, the interconnect lines 206, first select gates 208 (e.g., upper select gates, drain select gates (SGDs)), such as the additional conductive structures 145 (FIG. 1H, FIG. 1L) of the other stack 105 (FIG. 1H, FIG. 1L), select lines 209, and a second select gate 210 (e.g., a lower select gate, a source select gate (SGS)). The first select gates 208 may be horizontally divided (e.g., in the Y-direction) into multiple blocks 232 (e.g., corresponding to the blocks 140 (FIG. 1H, FIG. 1L)) horizontally separated (e.g., in the Y-direction) from one another by slots 230 (e.g., corresponding to the dielectric material 146 (FIG. 1H, FIG. 1L) formed within the slot 133 (FIG. 1H, FIG. 1L) and the dielectric material 152 (FIG. 1H, FIG. 1L) of the additional slots 148 (FIG. 1H, FIG. 1L)). As described above, with reference to the electronic devices 100, 100', the size, shape, and orientation of the additional slots 148 relative to the upper pillars 135, 137 (FIG. 1H, FIG. 1L) and the interconnect structures 158 (FIG. 1H, FIG. 1L) may facilitate formation of the first select gates 208 exhibiting a relatively improved properties.

Vertical conductive contacts 211 may electrically couple components to each other as shown. For example, the select lines 209 may be electrically coupled to the first select gates 208 and the interconnect lines 206 may be electrically coupled to the conductive structures 205. The electronic device 200 may also include a control unit 212 positioned under the memory array, which may include at least one of string driver circuitry, pass gates, circuitry for selecting gates, circuitry for selecting conductive lines (e.g., the data lines 202, the interconnect lines 206), circuitry for amplifying signals, and circuitry for sensing signals. The control unit 212 may be electrically coupled to the data lines 202, the source tier 204, the interconnect lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., digit lines, bit lines) may extend horizontally in a second direction (e.g., in the Y-direction) that is at an angle (e.g., perpendicular) to the first direction in which the first select gates 208 extend. Individual data lines 202 may be coupled to individual groups of the vertical strings 207 extending the second direction (e.g., the Y-direction) at the first end (e.g., the upper end) of the vertical strings 207 of the individual groups. Additional individual groups of the vertical strings 207 extending the first direction (e.g., the X-direction) and coupled to individual first select gates 208 may share a particular vertical string 207 thereof with individual group of vertical strings 207 coupled to an individual data line 202. Thus, an individual vertical string 207 of memory cells 203 may be selected at an intersection of an individual first select gate 208 and an individual data line 202. Accordingly, the first select gates 208 may be used for selecting memory cells 203 of the vertical strings 207 of memory cells 203.

The conductive structures 205 (e.g., word line word lines, such as the conductive structures 142 (FIG. 1H, FIG. 1L)) may extend in respective horizontal planes. The conductive structures 205 may be stacked vertically, such that each conductive structure 205 is coupled to at least some of the vertical strings 207 of memory cells 203, and the vertical strings 207 of the memory cells 203 extend vertically through the stack structure including the conductive structures 205. The conductive structures 205 may be coupled to or may form control gates of the memory cells 203.

The first select gates 208 and the second select gates 210 may operate to select a vertical string 207 of the memory cells 203 interposed between data lines 202 and the source tier 204. Thus, an individual memory cell 203 may be selected and electrically coupled to a data line 202 by operation of (e.g., by selecting) the appropriate first select gate 208, second select gate 210, and conductive structure 205 that are coupled to the particular memory cell 203.

The staircase structure 220 may be configured to provide electrical connection between the interconnect lines 206 and the conductive structures 205 through the vertical conductive contacts 211. In other words, an individual conductive structure 205 may be selected via an interconnect line 206 in electrical communication with a respective vertical conductive contact 211 in electrical communication with the conductive structure 205. The data lines 202 may be electrically coupled to the vertical strings 207 through conductive contact structures 234 (e.g., corresponding to the interconnect structures 158 (FIG. 1H, FIG. 1L)).

Thus, in accordance with embodiments of the disclosure an electronic device comprises a stack comprising tiers of alternating conductive structures and insulative structures overlying a source tier, and strings of memory cells extending vertically through the stack. The strings of memory cells individually comprise a channel material extending vertically through the stack. The electronic device comprises an additional stack overlying the stack and comprising tiers of alternating additional conductive structures and additional insulative structures, and pillars extending through the additional stack and overlying the strings of memory cells. Each of the pillars is horizontally offset in a first horizontal direction and in a second horizontal direction transverse to the first horizontal direction from a center of a corresponding string of memory cells. The electronic device comprises conductive lines overlying the pillars, and interconnect structures directly contacting the pillars and the conductive lines.

Thus, in accordance with additional embodiments of the disclosure, an electronic device comprises strings of memory cells extending through a first stack comprising tiers of alternating first conductive structures and first insulative structures. The strings of memory cells comprise at least a dielectric material and a channel material extending vertically through the first stack. The electronic device comprises a second stack comprising tiers of alternating second conductive structures and second insulative structures overlying the first stack, conductive lines overlying the second stack and extending in a horizontal direction, and a first pillar extending through the second stack and overlying a first of the strings of memory cells. The first pillar is horizontally offset from a center of the first of the strings of memory cells at a first acute angle to the horizontal direction. The electronic device comprises a second pillar extending through the second stack and vertically overlying a second of the strings of memory cells. The second pillar is horizontally offset from a center of the second of the strings of memory cells at a second acute angle from the horizontal direction. One or more of the first pillar and the second pillar comprises a lower portion laterally adjacent to the second conductive structures of the second stack and an upper portion located above an uppermost second conductive structure.

Thus, in accordance with further embodiments of the disclosure, a method of forming an electronic device comprises forming a first stack comprising alternating first materials and second materials over a source tier, forming strings of memory cells comprising a channel material extending vertically through the first stack, forming a second stack comprising alternating additional first materials and additional second materials over the first stack, and forming pillars comprising an additional channel material extending through the second stack and over some of the strings of memory cells. A center of each of the pillars is horizontally offset in a first horizontal direction and in a second horizontal direction transverse to the first horizontal direction from a center of a corresponding string of memory cells. The method comprises forming conductive lines over the pillars, and forming interconnect structures directly contacting the pillars and the conductive lines.

Figure 3:
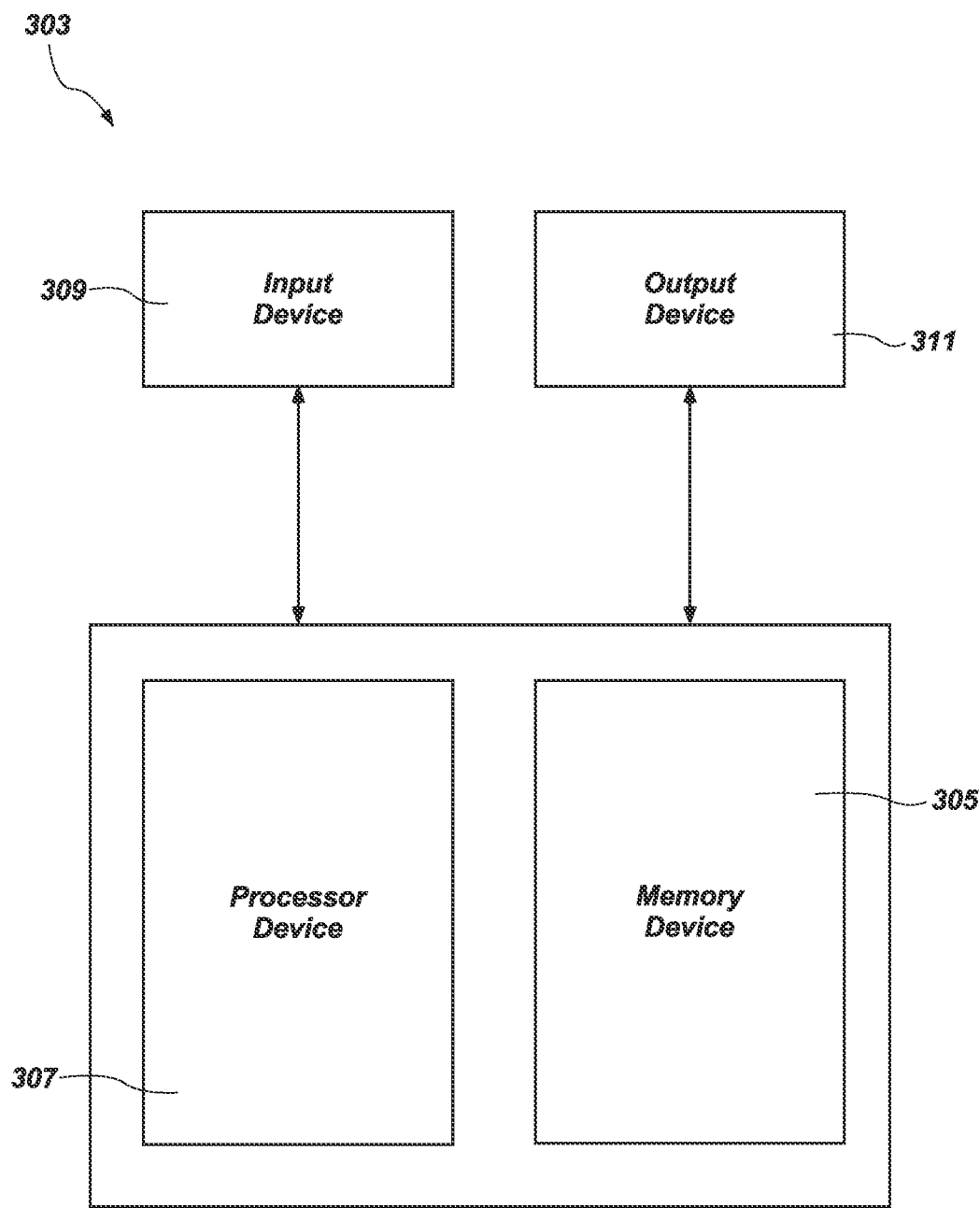
FIG. 3 is a block diagram of an electronic system, in accordance with embodiments of the disclosure.

Electronic devices (e.g., the electronic devices 100, 100', 200) including the weave pattern of the additional slots 148 and the horizontal offset (e.g., in each of the X-direction and the Y-direction) of the upper pillars 135, 137, according to embodiments of the disclosure, may be used in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of an electronic device (e.g., the electronic devices 100, 100', 200) previously described with reference to FIGS. 1A through 1N and FIG. 2, including the weave pattern of the additional slots 148 and the horizontal offset (e.g., in each of the X-direction and the Y-direction) of the upper pillars 135, 137.

The electronic system 303 may further include at least one electronic signal processor device 307 (often referred to as a "microprocessor"). The electronic signal processor device 307 may optionally include an embodiment of an electronic device (e.g., one or more of the electronic devices 100, 100', 200 previously described with reference to FIGS. 1A through 1N and FIG. 2). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
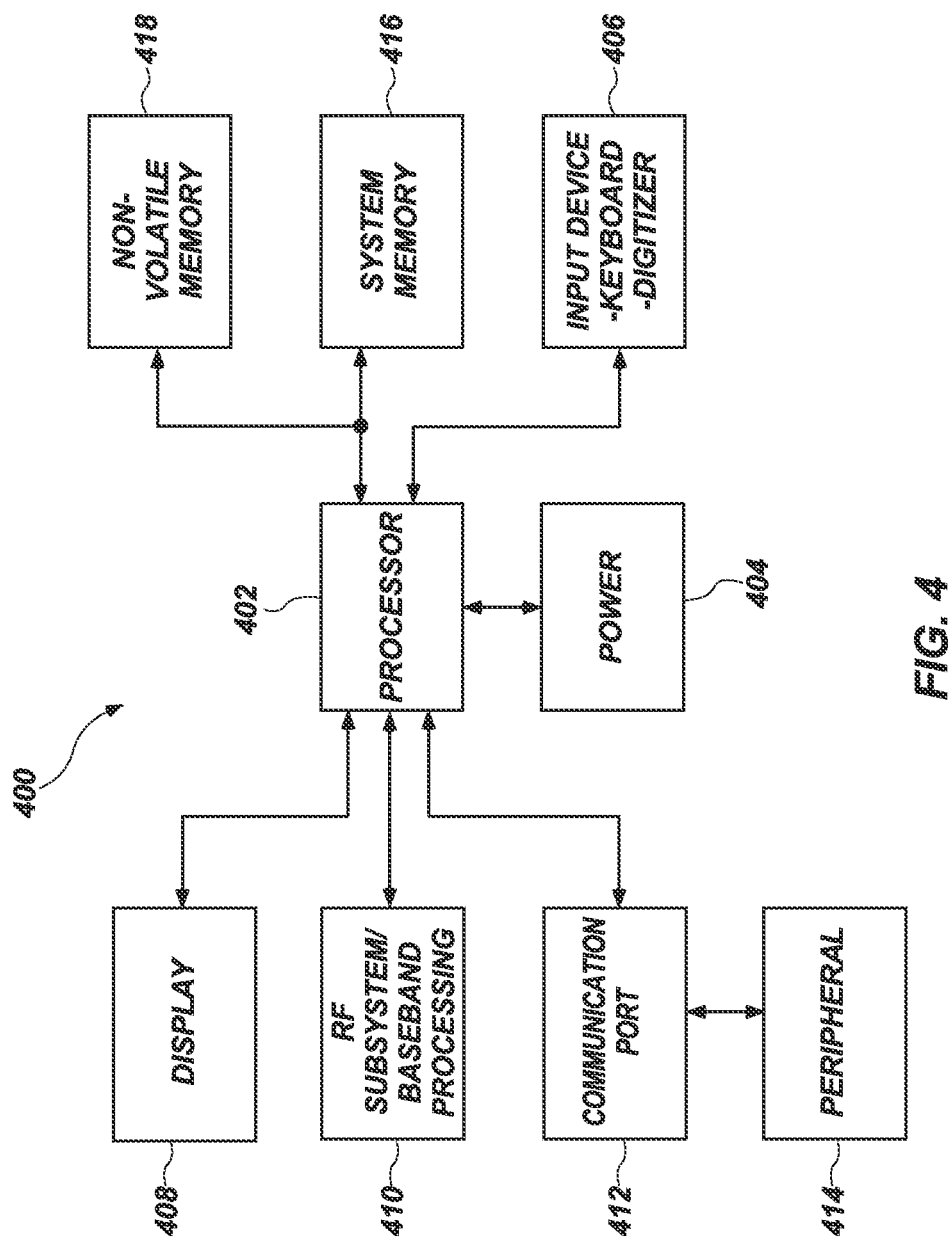
FIG. 4 is a block diagram of a processor-based system, in accordance with embodiments of the disclosure.

With reference to FIG. 4, depicted is a processor-based system 400. The processor-based system 400 may include various electronic devices (e.g., the electronic devices 100, 100', 200) manufactured in accordance with embodiments of the present disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include electronic devices (e.g., the electronic devices 100, 100', 200) manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the electronic devices (e.g., the electronic devices 100, 100', 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include electronic devices, such as the electronic devices (e.g., the electronic devices 100, 100', 200) described above, or a combination thereof.

Thus, in accordance with embodiments of the disclosure a system comprises a processor operably coupled to an input device and an output device, and electronic devices operably coupled to the processor. One or more of the electronic devices comprises vertically extending strings of memory cells coupled to access line structures and at least one source structure, and pillars overlying and coupled to the vertically extending strings of memory cells. Each of the pillars comprises an insulative material, and a channel material substantially laterally surrounding the insulative material. The one or more electronic devices also comprises elliptical conductive structures overlying and coupled directly to the channel material of the pillars, and digit line structures overlying and coupled directly to the elliptical conductive structures.

The electronic devices and systems of the disclosure advantageously facilitate one or more of improved simplicity, greater packaging density, and increased miniaturization of components as compared to conventional devices and conventional systems. The methods of the disclosure facilitate the formation of devices (e.g., apparatuses, microelectronic devices, memory devices) and systems (e.g., electronic systems) having one or more of improved performance, reliability, and durability, lower costs, increased yield, increased miniaturization of components, improved pattern quality, and greater packaging density as compared to conventional devices (e.g., conventional apparatuses, conventional electronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
    a stack comprising tiers of alternating conductive structures and insulative structures overlying a source tier;
    strings of memory cells extending vertically through the stack, the strings of memory cells individually comprising a channel material extending vertically through the stack;
    an additional stack overlying the stack and comprising tiers of alternating additional conductive structures and additional insulative structures;
    pillars extending through the additional stack and overlying the strings of memory cells, each of the pillars horizontally offset in a first horizontal direction and in a second horizontal direction transverse to the first horizontal direction from a center of a corresponding string of memory cells;
    conductive lines overlying the pillars; and
    interconnect structures directly contacting the pillars and the conductive lines.

2. The electronic device of claim 1, wherein the pillars comprise an additional channel material extending vertically through the additional stack and in electrical communication with the channel material of the strings of memory cells.

3. The electronic device of claim 2, further comprising a conductive plug structure between the channel material and the additional channel material, wherein the channel material, the conductive plug structure, and the additional channel material comprises a continuous portion of a conductive material extending from the source tier to a lower surface of the interconnect structures.

4. The electronic device of claim 3, wherein the conductive material of one or more of the channel material and the additional channel material comprises polysilicon.

5. The electronic device of claim 1, wherein the conductive lines comprise digit lines and the interconnect structures comprise digit line contacts, the digit lines exhibiting the same material composition as the digit line contacts.

6. The electronic device of claim 1, wherein the interconnect structures are elongated in a direction of the conductive lines, portions of the interconnect structures extending beyond a horizontal boundary of the corresponding string of memory cells.

7. The electronic device of claim 1, wherein at least some of the pillars comprise a lower portion exhibiting a first width and an upper portion comprising a second, greater width.

8. The electronic device of claim 7, wherein the upper portion of the pillars comprises a conductive material overlying a semiconductive material.

9. The electronic device of claim 1, wherein the pillars comprise device structures laterally adjacent to the additional conductive structures of the additional stack.

10. The electronic device of claim 1, wherein each of the interconnect structures comprises a single material comprising tungsten directly between the pillars and a corresponding conductive line.

11. The electronic device of claim 1, wherein the pillars comprise first pillars and second pillars, the first pillars shifted in a direction away from the second pillars in each of the first horizontal direction and the second horizontal direction.

12. A method of forming an electronic device, the method comprising:
forming a first stack comprising alternating first materials and second materials over a source tier;
forming strings of memory cells comprising a channel material extending vertically through the first stack;
forming a second stack comprising alternating additional first materials and additional second materials over the first stack;
forming pillars comprising an additional channel material extending through the second stack and over some of the strings of memory cells, a center of each of the pillars horizontally offset in a first horizontal direction and in a second horizontal direction transverse to the first horizontal direction from a center of a corresponding string of memory cells;
forming conductive lines over the pillars; and
forming interconnect structures directly contacting the pillars and the conductive lines.

13. The method of claim 12, wherein forming the pillars comprises forming the additional channel material in electrical communication with the channel material of the strings of memory cells to form a channel region including the channel material and the additional channel material.

14. The method of claim 13, wherein forming the channel region comprises forming a conductive material comprising doped polysilicon electrically connecting the channel material to the additional channel material.

15. The method of claim 12, wherein forming the interconnect structures comprises forming elongated portions of the interconnect structures to extend beyond a horizontal boundary of the corresponding string of memory cells in the first horizontal direction.

16. The method of claim 12, further comprising forming a first slot structure between neighboring strings of memory cells and forming a second slot structure between neighboring pillars, the second slot structure exhibiting a non-linear shape with a portion of the second slot structure vertically overlying a portion of some of the strings of memory cells.

17. The method of claim 12, wherein forming the pillars comprises forming the additional channel material laterally adjacent to the additional first materials and the additional second materials of the second stack and forming an insulative material within a central opening of the pillars.

18. An electronic device, comprising:
strings of memory cells extending through a first stack comprising tiers of alternating first conductive structures and first insulative structures, the strings of memory cells comprising at least a dielectric material and a channel material extending vertically through the first stack;
a second stack comprising tiers of alternating second conductive structures and second insulative structures overlying the first stack;
conductive lines overlying the second stack and extending in a horizontal direction;
a first pillar extending through the second stack and overlying a first of the strings of memory cells, the first pillar horizontally offset from a center of the first of the strings of memory cells at a first acute angle to the horizontal direction;
a second pillar extending through the second stack and vertically overlying a second of the strings of memory cells, the second pillar horizontally offset from a center of the second of the strings of memory cells at a second acute angle from the horizontal direction, one or more of the first pillar and the second pillar comprising a lower portion laterally adjacent to the second conductive structures of the second stack and an upper portion located above an uppermost second conductive structure; and
the second conductive structures comprising upper select gates separated from the first conductive structures by an interdeck region, the lower portion of the first pillar and the second pillar laterally adjacent to the upper select gates, and the upper portion of the first pillar and the second pillar located above an uppermost upper select gate.

19. The electronic device of claim 18, further comprising a source underlying the first stack and interconnect structures overlying the second stack, wherein a channel region including the channel material of the strings of memory cells, a conductive plug material, and an additional channel material of each of the first pillar and the second pillar extends directly between the source and the interconnect structures.

20. The electronic device of claim 18, further comprising a dielectric material within slot structures extending at least partially through the second stack, the slot structures individually exhibiting a non-linear shape, wherein the first pillar is offset from a center of the first of the strings of memory cells in the horizontal direction and away from the slot structures and the second pillar is offset from the center of the second of the strings of memory cells in the horizontal direction and away from the slot structures.

21. The electronic device of claim 20, wherein two or more of the slot structures horizontally neighboring one another are spaced by at least one column including the first pillar and at least one column including the second pillar, the slot structures separating a column including the first pillar from a column including the second pillar.

22. The electronic device of claim 18, wherein the upper portion of the first pillar and the second pillar is relatively wider than the lower portion thereof, a lateral extent of the strings of memory cells being greater than a lateral extent of the upper portion of the first pillar and the second pillar.

23. A system, comprising:
a processor operably coupled to an input device and an output device; and
electronic devices operably coupled to the processor, the one or more of the electronic devices comprising:

vertically extending strings of memory cells coupled to access line structures and at least one source structure;

pillars overlying and coupled to the vertically extending strings of memory cells, each of the pillars comprising:
  an insulative material; and
  a channel material substantially laterally surrounding the insulative material;

elliptical conductive structures overlying and coupled directly to the channel material of the pillars; and digit line structures overlying and coupled directly to the elliptical conductive structures.

24. The system of claim 23, wherein a central axis of each of the pillars is offset in a first horizontal direction and in a second horizontal direction, orthogonal to the first horizontal direction relative to a central axis of a corresponding string of memory cells.

25. The system of claim 23, wherein:
upper portions of the pillars exhibit a first cross-sectional area; and
lower portions of the pillars underlying the upper portions thereof exhibit a second, smaller cross-sectional area, at least the lower portions laterally adjacent to select gate structures.

* * * * *